(12) United States Patent
Martinez et al.

(10) Patent No.: US 10,461,040 B2
(45) Date of Patent: Oct. 29, 2019

(54) MATCHED CERAMIC CAPACITOR STRUCTURES

(71) Applicant: Apple Inc., Cupertino, CA (US)

(72) Inventors: Paul A. Martinez, Morgan Hill, CA (US); Ming Y. Tsai, San Jose, CA (US); Won Seop Choi, Pleasanton, CA (US)

(73) Assignee: APPLE INC., Cupertino, CA (US)

( * ) Notice: Subject to any disclaimer, the term of this patent is extended or adjusted under 35 U.S.C. 154(b) by 13 days.

(21) Appl. No.: 15/636,408

(22) Filed: Jun. 28, 2017

(65) Prior Publication Data

US 2019/0006287 A1 Jan. 3, 2019

(51) Int. Cl.
| | |
|---|---|
| *H01L 23/552* | (2006.01) |
| *H01L 23/64* | (2006.01) |
| *H01L 49/02* | (2006.01) |
| *H01G 4/30* | (2006.01) |
| *H01G 4/248* | (2006.01) |
| *H01G 4/232* | (2006.01) |
| *H01G 4/12* | (2006.01) |

(52) U.S. Cl.
CPC .............. *H01L 23/552* (2013.01); *H01G 4/12* (2013.01); *H01G 4/232* (2013.01); *H01G 4/248* (2013.01); *H01G 4/30* (2013.01); *H01L 23/642* (2013.01); *H01L 28/60* (2013.01)

(58) Field of Classification Search
CPC ..... H01L 23/552; H01L 23/642; H01L 28/60; H01L 28/86–92; H01L 28/40; H01G 4/30–308; H01G 4/38; H01G 4/385; H01G 4/228; H01G 4/232; H01G 4/236; H01G 4/248
See application file for complete search history.

(56) References Cited

U.S. PATENT DOCUMENTS

| | | | |
|---|---|---|---|
| 6,212,060 B1 | 4/2001 | Liu | |
| 7,224,569 B2* | 5/2007 | Togashi | H01G 4/232 361/303 |
| 7,688,568 B1* | 3/2010 | Lee | H01G 4/232 361/303 |
| 8,988,851 B1* | 3/2015 | Sawada | H01G 4/232 361/301.4 |
| 2006/0209492 A1* | 9/2006 | Togashi | H01G 4/232 361/303 |
| 2009/0059469 A1* | 3/2009 | Lee | H01G 4/012 361/306.2 |
| 2009/0097187 A1* | 4/2009 | Dattaguru | H01G 4/232 361/321.2 |
| 2009/0139757 A1* | 6/2009 | Lee | H01G 4/005 174/260 |
| 2009/0244807 A1* | 10/2009 | Lee | H01G 4/005 361/306.2 |

(Continued)

*Primary Examiner* — Zandra V Smith
*Assistant Examiner* — Jeremy J Joy
(74) *Attorney, Agent, or Firm* — Fletcher Yoder PC

(57) ABSTRACT

Capacitor devices having multiple capacitors with similar nominal capacitances are described. The capacitors may be multilayer ceramic capacitors (MLCCs) and may be fabricated employing class 2 materials. The arrangement of the electrodes in the device may reduce relative variations between the capacitors of the device. The capacitor devices may be allow high performance and compact electrical circuits that may employ matched capacitors.

21 Claims, 25 Drawing Sheets

(56) References Cited

U.S. PATENT DOCUMENTS

| | | | |
|---|---|---|---|
| 2013/0201603 A1* | 8/2013 | Chung | H01G 4/012 361/303 |
| 2015/0016016 A1 | 1/2015 | Lee | |
| 2015/0062775 A1* | 3/2015 | Shibasaki | H01G 4/30 361/301.4 |
| 2015/0115893 A1* | 4/2015 | Lee | H01G 4/30 320/135 |
| 2015/0146343 A1* | 5/2015 | Ellmore | H01G 4/30 361/301.4 |
| 2015/0325371 A1* | 11/2015 | Hattori | H01G 4/385 361/301.4 |
| 2016/0104577 A1 | 4/2016 | Cho | |
| 2017/0162335 A1* | 6/2017 | Ritter | H01G 7/06 |
| 2017/0339792 A1* | 11/2017 | Hattori | H01G 4/012 |
| 2018/0137982 A1* | 5/2018 | Sawada | H01G 4/248 |
| 2018/0226191 A1* | 8/2018 | Yoshida | H05K 1/111 |

\* cited by examiner

MATCHED CERAMIC CAPACITOR STRUCTURES

BACKGROUND

The present disclosure relates generally to capacitor structures, and more particularly, to capacitor structures having pairs of matched capacitors.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Several electronic devices include electronic circuits that employ capacitors for energy storage, resonant and tuning circuits, impedance matching, filtering, and other purposes. Compact design for these circuits may be achieved by using certain ceramic capacitors that may have high capacitance density due to using dielectric with particularly high permittivity. Examples of such capacitors may include class 2 multilayer ceramic capacitors (MLCC). However, high capacitance-density materials may led to devices that suffer from lack of accuracy and/or stability. For example, class 2 capacitors may have large specified tolerance margins, may suffer from large variations in the capacitance value due to temperature changes, may present voltage derating (i.e., capacitance degradation upon increase direct current (DC) voltage), and may suffer piezoelectric vibrations.

Electrical circuits that employ multiple capacitors with identical nominal specifications (i.e., matched capacitors), may be particularly vulnerable to problems arising from high capacitance density device, as the performance of the circuit may be related to how well matched the two components are. Lack of accuracy and stability in these ceramic capacitors result in other capacitors being preferred, which results in larger, non-compact electrical circuits.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments described herein are related to capacitor devices that may include multiple capacitors having substantially the same nominal specifications. These monolithic devices may have an even number of matched capacitors produced from high capacitance density ceramic materials. Capacitors may be produced employing multilayer ceramic capacitor (MLCC) methods and techniques disclosed herein.

An appropriate layout for the electrodes and an arrangement of the layers of the MLCC device may mitigate relative changes between the pairs of matched capacitors of the device. For example, stacks of electrodes of a first capacitor of a pair may be interweaved with stacks of electrodes of a second capacitor of the pair. As a result, changes in the first capacitor due to physical and/or other regional perturbations may be correlated with changes in the second capacitor, reducing the potential for relative mismatching. In another example, each layer may have electrodes of both matched capacitors, such that variations to the electrodes due to material variations may be correlated. Parasitic capacitances between matched capacitors that may arise due to the monolithic embodiment may be mitigated by physical separation between electrodes of different capacitors and/or by introduction of shielding layers between electrodes of different capacitors.

In an embodiment, a device with a square bottom and at least two capacitors having two electrical terminations each are described. In another embodiment a device having two capacitors, and each capacitor includes a stack of electrodes is described. Each stack of electrodes may be formed from two sets of electrode such that each electrode of the second set is disposed between two electrodes of the first set. In another embodiment, a device having two capacitors that include two sets of ceramic sheets is described. Each ceramic sheet may include electrodes of each of the capacitors of the device. Embodiments disclosed herein also include methods for productions of the MLCCs, as well as the usage of matched capacitor structures in electrical devices.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Various electronic devices may employ capacitors for energy storage, tuning, impedance matching, noise filtering, and other functionalities. To obtain compact circuitry, capacitors that have high capacitance density (i.e., high capacitance per unit volume) may be used. Examples of high capacitance density include, but are not limited to, class 2 multilayer ceramic capacitors (MLCC). Class 2 MLCCs capacitors may be produced from ceramic materials that provide high dielectric constants, which may lead to the high capacitance density. The ceramic materials employed in class 2 MLCCs present certain characteristics that may lead to performance deficiencies related to the reliability and stability of the capacitor structure.

Circuits that may employ multiple capacitors with identical nominal specifications (e.g., matched capacitors) may be particularly sensitive to these variations, as the relative changes between the matched capacitors may lead to undesired electrical behavior. For example, certain heart rate monitors, such as the ones that may be found in wearable fitness devices, may use matched capacitors in the sensing circuitry. The low amplitude, low frequency electrical signal detected from the heart may be detected as a differential signal, and matched capacitors may be used to improve the electrical circuitry that processes the heart rate signal. Embodiments described herein are related to capacitor structures that may have multiple matched capacitors in a single monolithic structure. The monolithic construction, the layout of the electrodes, and/or the arrangement of the electrodes may mitigate the relative changes between the capacitor structures by correlating the variations in one of the capacitors of the structure with variations in the other capacitors in the structures. This correlation between the capacitors may be further achieved by the disposition of the layers in the electrodes of the MLCC and the placement of the electrode terminations, as detailed below. Potential parasitic capacitances in the monolithic design may be mitigated by physical separation between the electrodes and/or introduction of a shielding layer.

Figure 1:
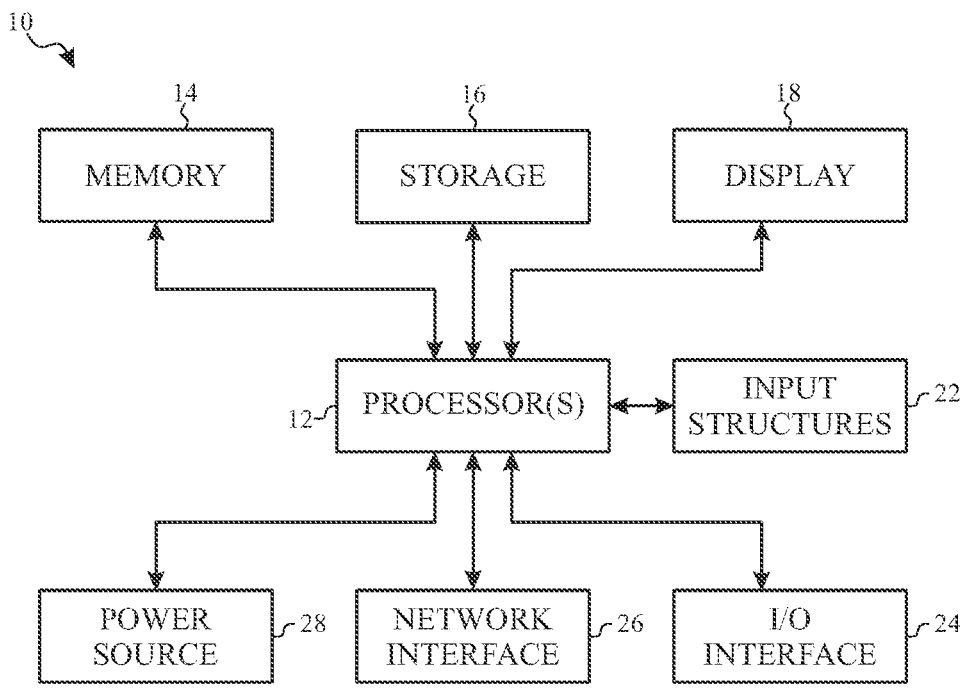
FIG. 1 is a schematic block diagram of an electronic device that may benefit from the inclusion of one or more matched capacitor devices, in accordance with an embodiment.

With the foregoing in mind, a general description of suitable electronic devices that may employ a device having matched capacitors in its circuitry will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
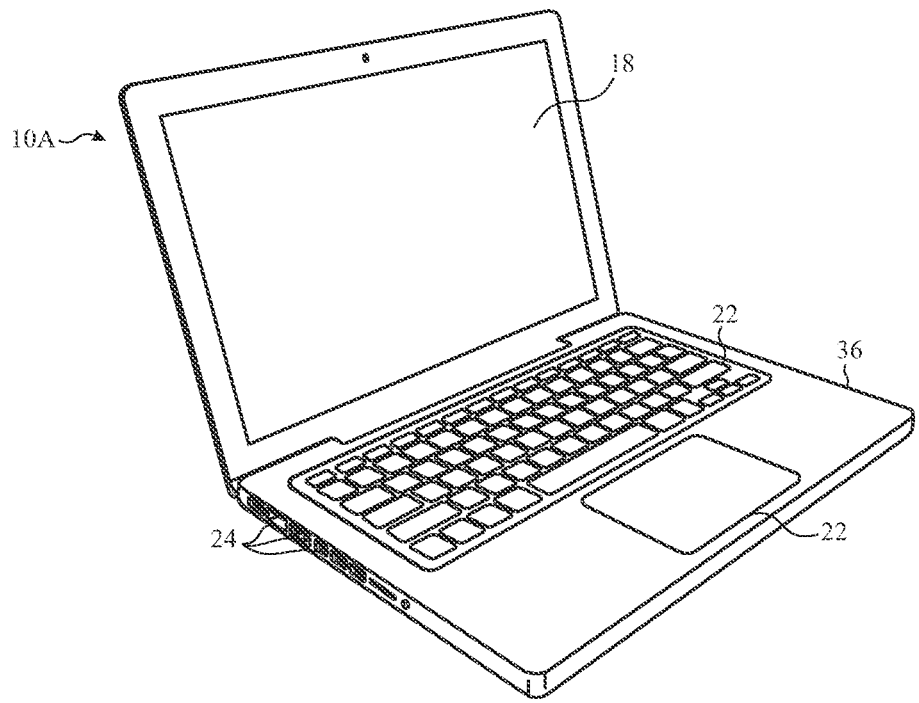
FIG. 2 is a perspective view of a notebook computer representing an embodiment of the electronic device of FIG. 1.
Figure 3:
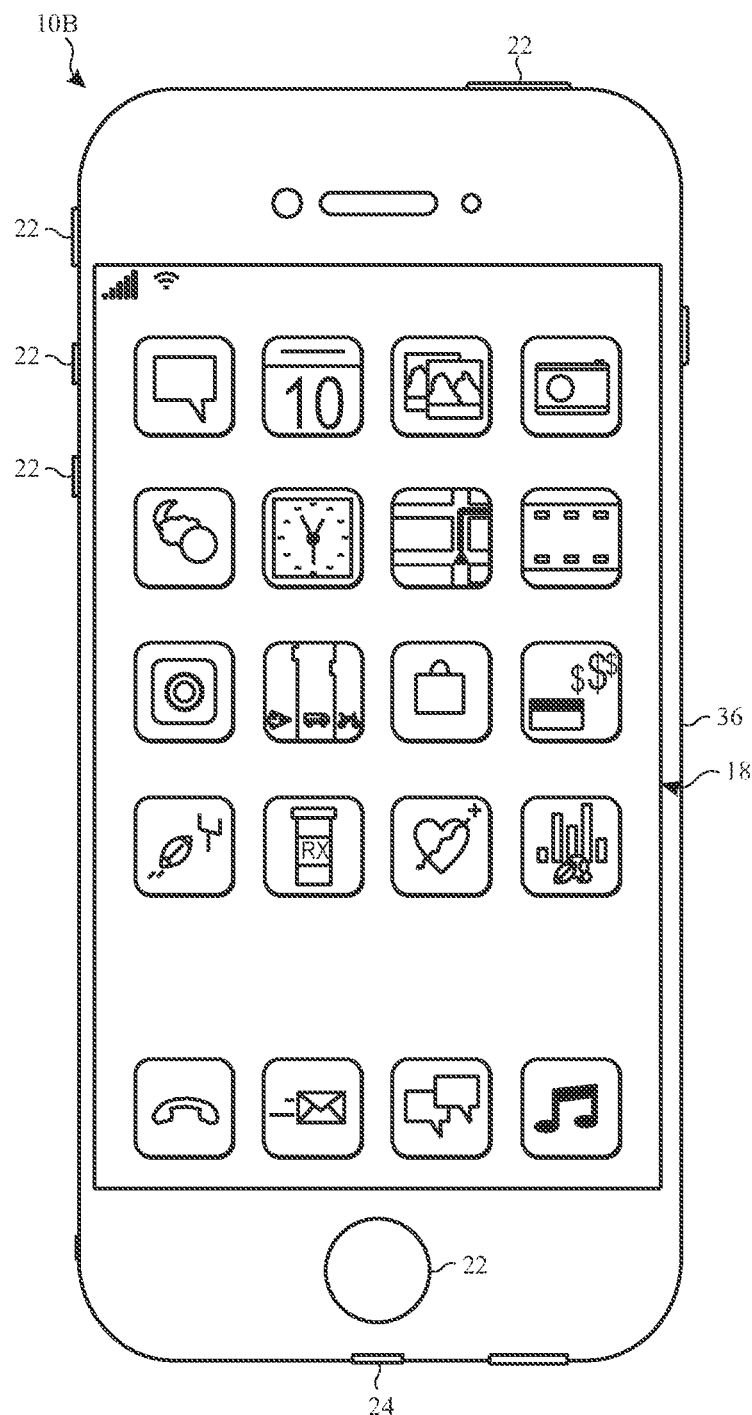
FIG. 3 is a front view of a hand-held device representing another embodiment of the electronic device of FIG. 1.
Figure 4:
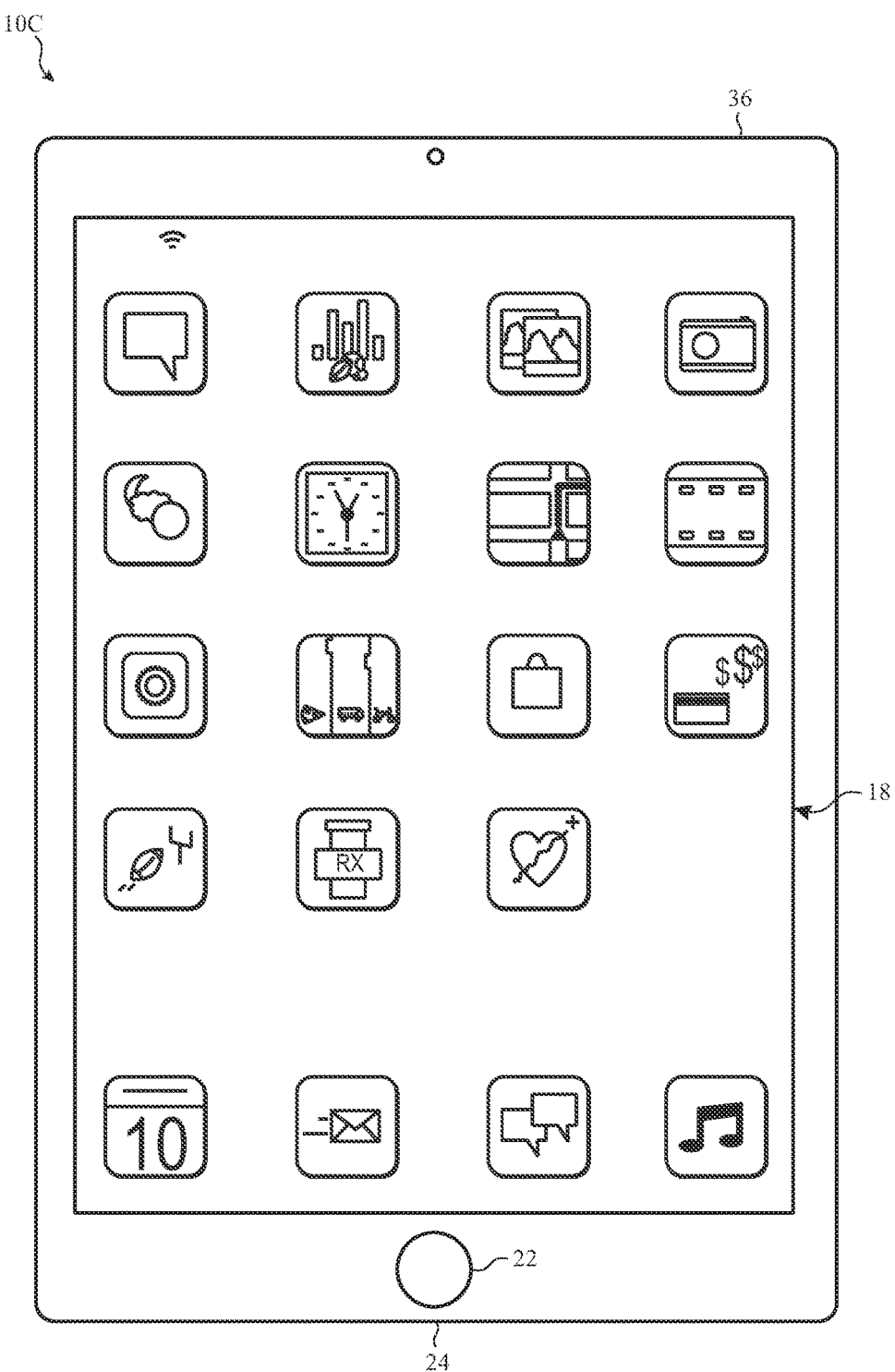
FIG. 4 is a front view of another hand-held device representing another embodiment of the electronic device of FIG. 1.
Figure 5:
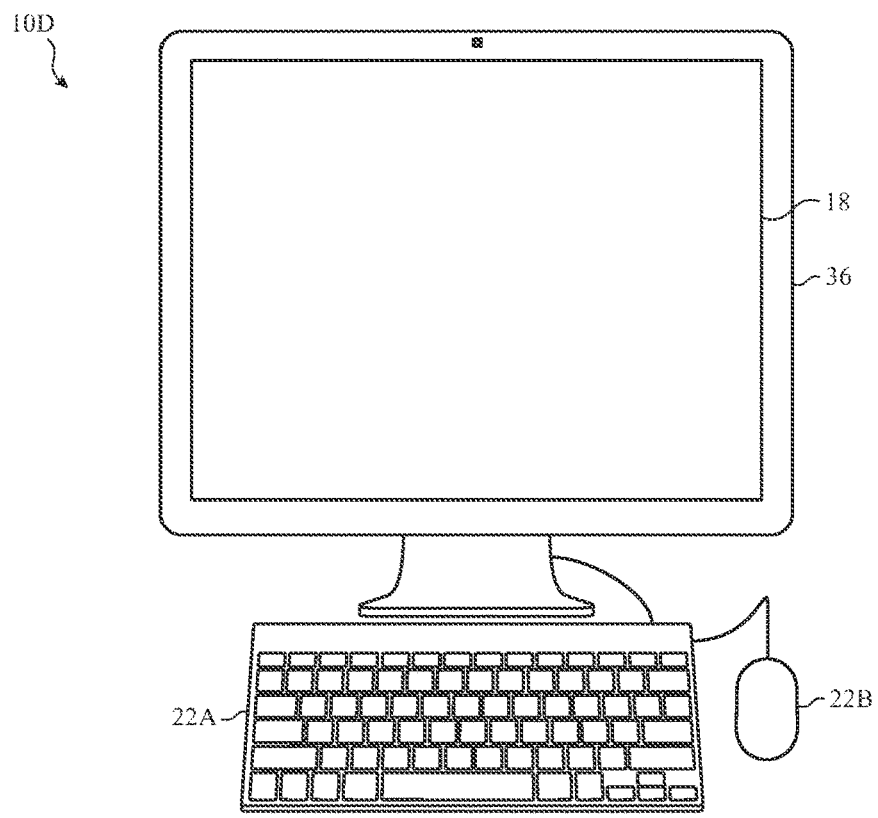
FIG. 5 is a front view of a desktop computer representing another embodiment of the electronic device of FIG. 1.
Figure 6:
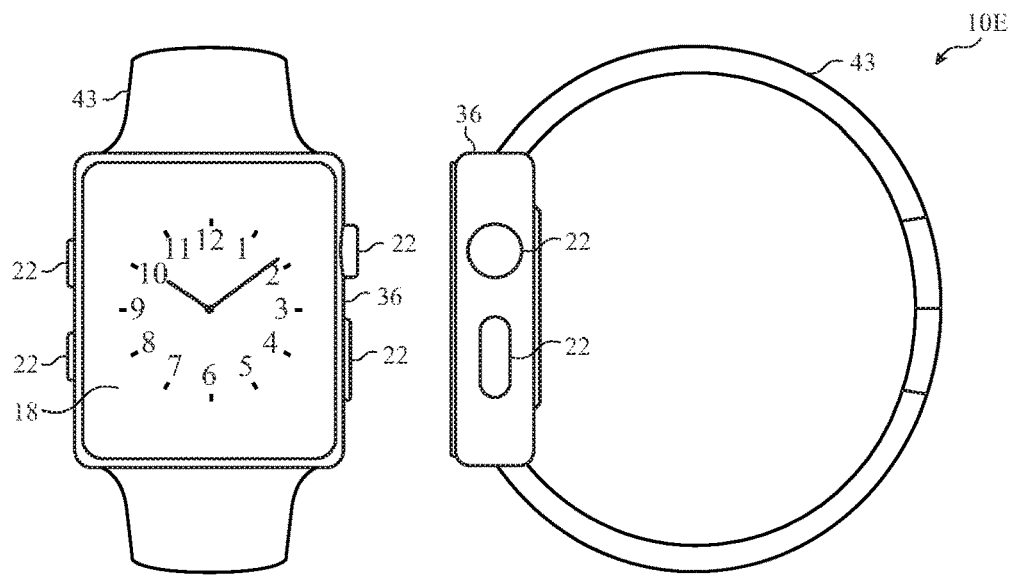
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. Network interfaces 26 such as the one described above may benefit from the use of tuning circuitry, impedance matching circuitry and/or noise filtering circuits that may include matched capacitor devices such as the ones described herein. As further illustrated, the electronic device 10 may include a power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
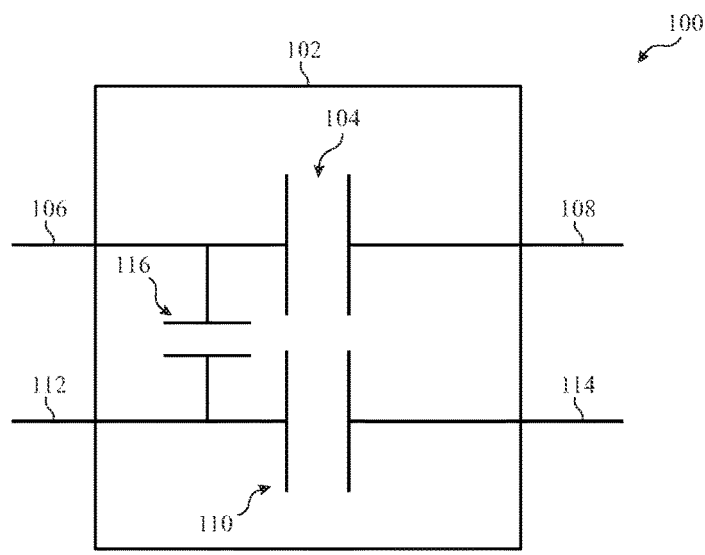
FIG. 7 is a schematic diagram of a matched capacitor device, which may be included in the electronic device of FIG. 1, in accordance with an embodiment.

Electronic devices 10A, 10B, 10C, 10D, and 10E described above may all employ matched capacitors in analog circuitry such as in tuning circuits, impedance matching circuits, power decoupling circuits, filtering circuits, amplifiers, power controllers, and other circuitry. Embodiments for monolithic devices having multiple matched capacitors are described herein. For example, diagram 100 in FIG. 7 illustrates a dual capacitor device 102 having two capacitors. A first capacitor 104 may be coupled to terminations 106 and 108 and a second capacitor 110 may be coupled to terminations 112 and 114. As detailed below, relative changes between capacitors 104 and 110 due to fabrication, temperature, or usage may be mitigated particular arrangement of electrodes. In other words, dual capacitor device 102 is assembled such that changes to electrical characteristics of the first capacitor 104 correlate with changes to electrical characteristics of the second capacitor 110. It should be noted that the arrangement of electrodes may lead to the formation of a parasitic capacitance 116 between terminations 106 and 112.

Figure 8:
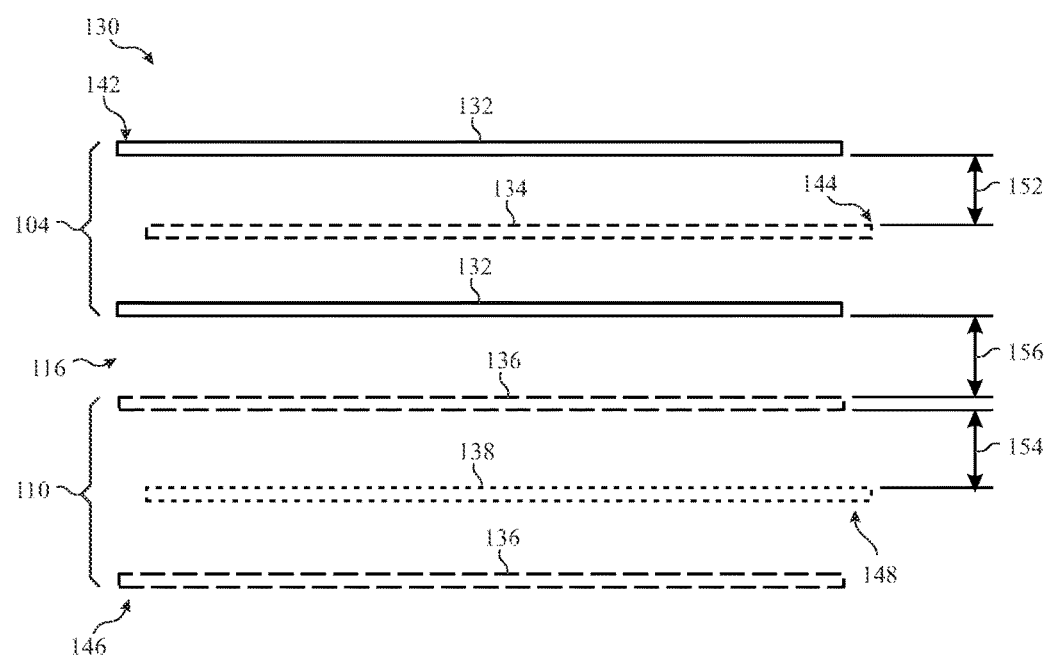
FIG. 8 is a schematic diagram of an electrode arrangement for the matched capacitor device of FIG. 7, in accordance with an embodiment.
Figure 23:
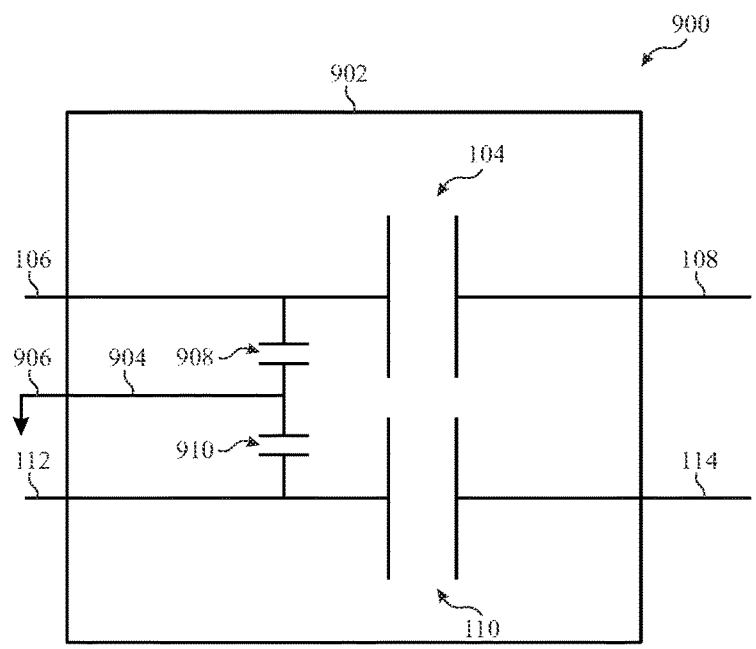
FIG. 23 is a schematic diagram of a matched capacitor device with a shielding layer that may be used in the electronic device of FIG. 1, in accordance with an embodiment.

FIG. 8 illustrates an electrode arrangement diagram 130 that may be used to form a dual capacitor structure 102. The top portion of diagram 130 may be a first capacitor 104 formed between electrodes 132 and 134. The bottom portion of diagram 130 may be a second capacitor 114 formed between electrodes 136 and 138. Note that in diagram 130, first capacitor 104 has two electrodes 132 and one electrode 134 leading to two capacitive interfaces. Similarly, second capacitor 110 has two electrodes 136 and one electrode 138, leading to two capacitive interfaces. Electrodes 132 may have a tab 142 that may be used to couple the electrode to an external termination 106. Similarly, electrode 134 may have a tab 144 that may couple to termination 108. In capacitor 110, electrodes 136 may have a tab 146 that may couple to termination 112 and electrode 138 may have a tab 148 that may couple to termination 114. Electrodes 132 and 144 of first capacitor 104 may be separated by a distance 152 and electrodes 136 and 138 of second capacitor 110 may be separated by a distance 154. Distance 152 and 154 may be substantially similar and, as a result, the nominal capacitances of capacitors 104 and 110 may be substantially similar. Note that a parasitic capacitance 116 may appear due to a capacitive interface between electrodes 132 and 136. This capacitance may be determined by the distance 156. In some embodiments, distance 156 may be chosen to be large and to reduce parasitic capacitance 116. In some embodiments, terminations coupled to electrodes 132 and 136 may be coupled to a common node (e.g., common ground, common rail) to eliminate a difference in voltages between electrodes 132 and 136, and mitigate effects from the parasitic capacitance. In some embodiments, a material that provides isolation between electrode plates 132 and 136 may be introduced, as discussed with respect to FIG. 23 below.

In several of the embodiments described herein, each capacitor may be formed by electrode layers, where each layer has different possible electrode layouts. Electrode layouts may differ in the physical disposition of tabs that couple the electrode to a termination, among other things. By having all the tabs placed in the same location, multiple electrodes using a common layout may be coupled to a single termination. For example, capacitor 104 is formed by layers having the layout of electrode 132 or the layout of electrode 134. The layout of electrode 132 has a tab 142 in the left side of diagram 130 whereas the layout of electrode 134 has a tab on the right side of diagram 130. This arrangement facilitates the assembly of dual devices with multiple terminations by proper design of layouts, as detailed in the embodiments described below.

Descriptions of embodiments for matched capacitors illustrated in FIGS. 9A, 9B, 19A, 19B, 19C, 20A, 20B, 21A, 21B, 22A, 22B, 25A, and 25B may reference certain orientations and/or directions. References to certain aspects of the views of the devices may be made with respect to a horizontal direction 152, a vertical direction 154, and a transversal direction 156. References to a horizontal plane may refer to the plane formed by the horizontal direction 152 and the transversal direction 156, and references to a vertical plane may refer to any plane that includes the vertical direction 154. References to a side of the devices may refer to any face of the devices that is in a perpendicular plane, while references to a bottom or a top of the devices may refer to faces of the devices that are parallel to the horizontal plane. Note that a reference to a bottom of a device may refer to a face of the device that is substantially in contact with a printed circuit board when the device is mounted as designed.

Figure 9A:
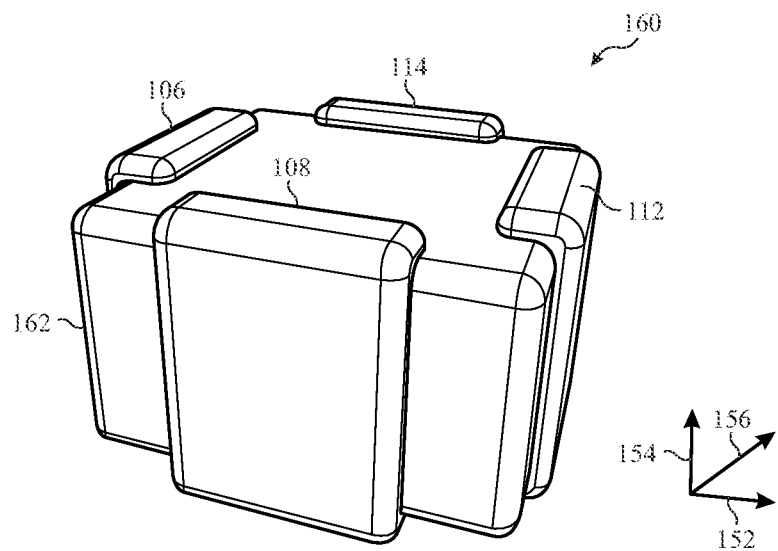
FIG. 9A is a perspective view of an embodiment for a matched capacitor device similar to the one of FIG. 7, in accordance with an embodiment.
Figure 9B:
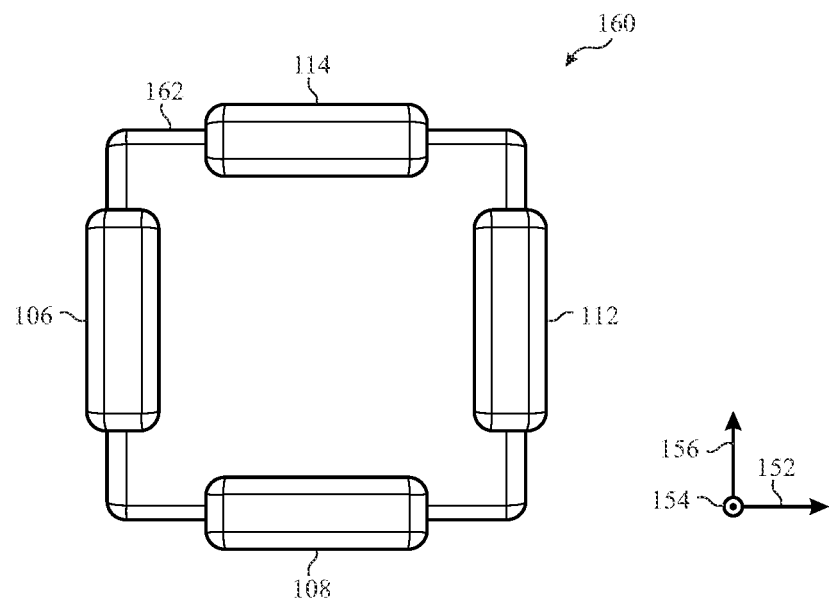
FIG. 9B is a top view of the matched capacitor of FIG. 9A, in accordance with an embodiment.

The perspective view in FIG. 9A illustrate a dual matched capacitor 160. Dual matched capacitor 160 may have a case 162. Along the sides of case 162, dual matched capacitor 160 may have terminations 106, 108, 112, and 114 for coupling with a printed circuit board. The top view in FIG. 9B shows that the case 162 of dual matched capacitor 160 may have a square right prism shape (e.g., a right prism with a square base, a square-shaped prism). The terminations 106, 108, 112, and 114 may be placed along the sides of case 162, with each side of case 162 having a single termination. Terminations may be placed in symmetrical positions, which may reduce perturbations in the relative capacitance between the two capacitors of the dual matched capacitor 160 that may arise from mechanical, material, and/or thermal variations.

Figure 10:
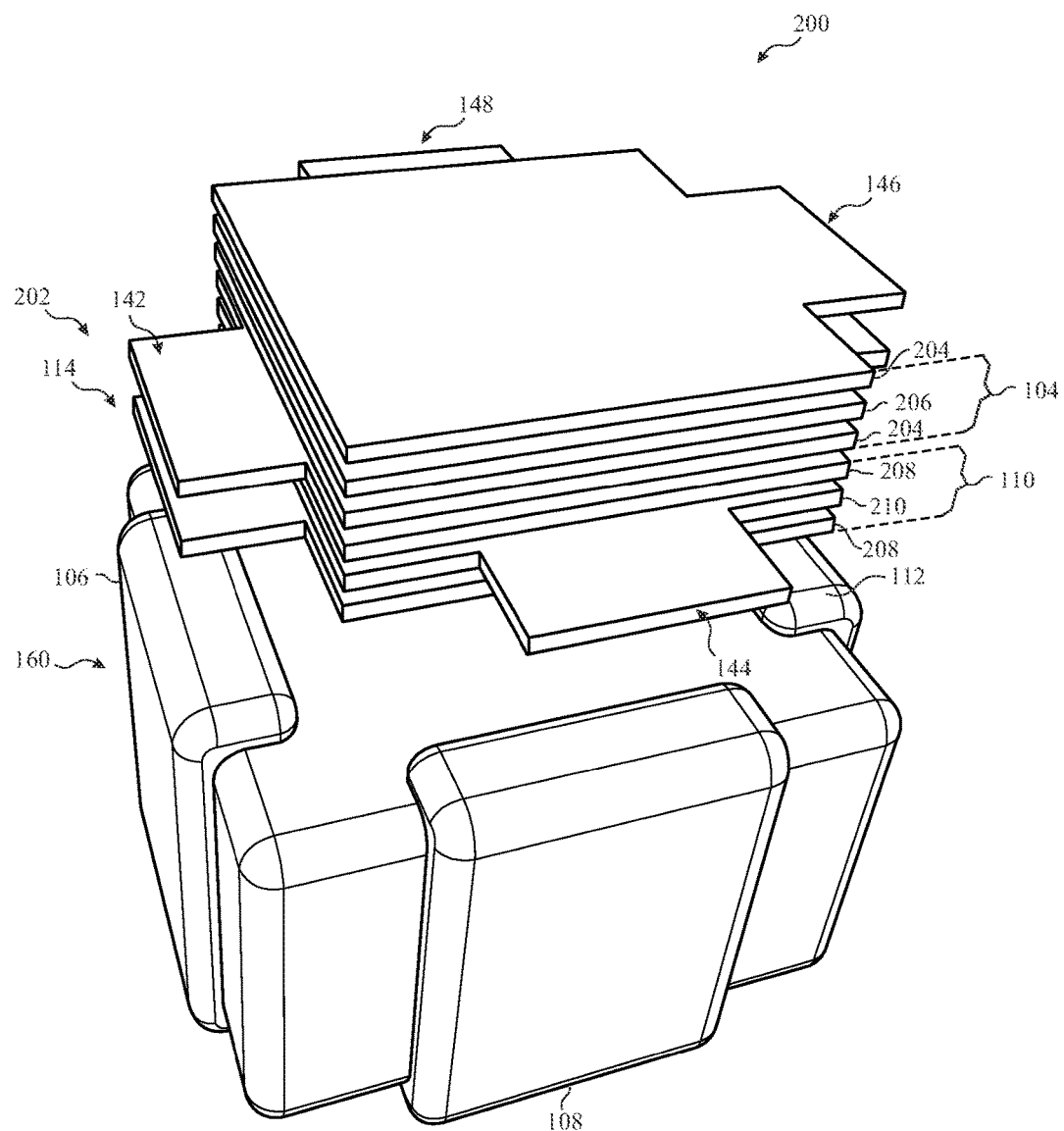
FIG. 10 is a perspective view of the matched capacitor of FIG. 9A with an exploded view of an electrode arrangement, in accordance with an embodiment.

Diagram 200 of FIG. 10 illustrate the dual matched capacitor 160 with an interweaving stack 202 that may be used the capacitive structures. Interweaving stack 202 may be located inside the case 162 of the dual matched capacitor 160 and the representation in diagram 200 is intended to illustrate the relative orientation between the electrodes in interweaving stack 202 and the terminations 106, 108, 112, and 114. A first capacitor 104, having terminations 106 and 108, may be formed by electrodes 208 and 210 and a second capacitor 110, having terminations 112 and 114, may be formed by electrodes 204 and 206. Once assembled, tabs 142 of electrodes 208 may be coupled to termination 106. Similarly, tabs 144 of electrode 210 may be coupled to termination 108, tabs 146 of electrodes 204 may be coupled to termination 112, and tabs 148 may be coupled to termination 114. This interweaving stack 202 may be referred to as a 1×1 interweaving stack. In a 1×1 interweaving stack, a stack 224 of electrodes of the first capacitor 104 is formed by a single electrode 210 being surrounded by (e.g., sandwiched between, disposed between) two electrodes 208, and a stack 230 of electrodes of the second capacitor 110 is formed by a single electrode 206 being surrounded by two electrodes 204.

Figure 11:
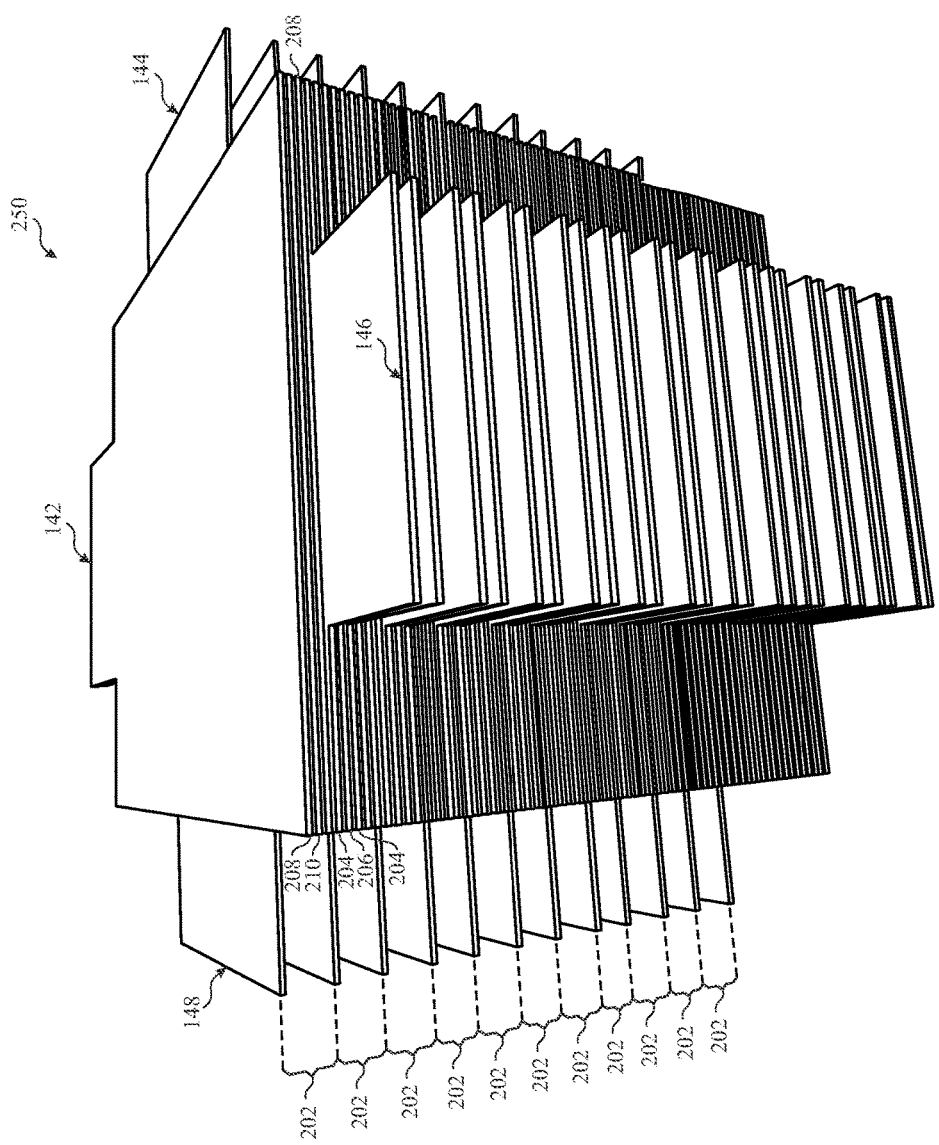
FIG. 11 is a perspective view of a stack using the alternative electrode arrangement for the matched capacitor device of FIG. 10, in accordance with an embodiment.

Diagram in FIG. 11 illustrates a stack arrangement 250 using multiple 1×1 interweaving stacks 202 of FIG. 10. In stack arrangement 250, multiple electrode stacks 224 are stacked atop electrodes stacks 230. In the example of FIG. 11, a first interweaving stack 202 is formed by electrodes 208, 210, 208 of a first capacitor and electrodes 204, 206, 204 of a second capacitor in an ordered sequence from top to bottom. A second 1×1 interweaving stack 202 is placed immediately below the first stack, following this same sequence of electrodes: 208, 210, 208, 204, 206, and 204. The FIG. 11 shows 12 electrode stacks 202 placed in the order above described. This capacitor structure may have a strong matching between first capacitor 104 and second capacitor 110, since any disturbances (e.g., thermal, mechanical) to electrodes 208 and 210 associated to first capacitor 204 are likely to also disturb electrodes 204 and 206 of the second capacitor 110 in a correlated manner. As a result, changes in the capacitance of first capacitor 104 are likely accompanied by correlated changes in the capacitance of second capacitor 110, reducing relative variations between the two capacitors of the dual capacitor device 160.

Note also that the 1×1 interweaving stack 202 has a capacitive interface between electrodes 204 and 208. This capacitive interface may lead to parasitic capacitances 116, as discussed above. In the stack arrangement 250, note that for every two capacitive interfaces between electrodes 204 and 206, there is one capacitive interface between electrodes 204 and 208. As a result, a dual matched capacitor device 160 may present a parasitic capacitance 116 between terminals 106 and 108 that may be as large as half the capacitance of first capacitor 104 and second capacitor 110. Effects of parasitic capacitance 116 may be mitigated in certain circuits designs in which terminals 106 and 108 may be coupled to a common wire, a ground, or a rail.

Figure 12:
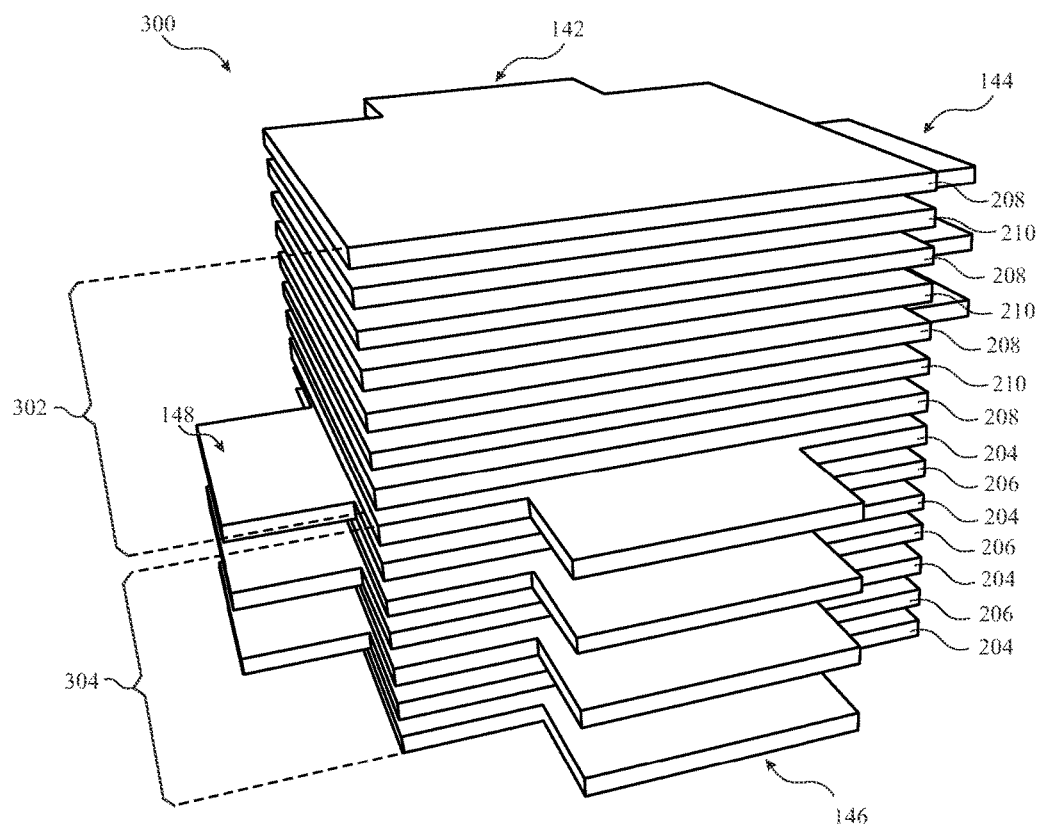
FIG. 12 is a exploded perspective view of an alternative electrode arrangement for the matched capacitor device of FIG. 9A, in accordance with an embodiment.

The diagram in FIG. 12 illustrates an alternative interweaving stack 300 that may be used to assemble a dual matched capacitor 160 illustrated in FIG. 9A. Interweaving stack 300 may have a first electrode stack 302 that may form a first capacitor 104, and a second electrode stack 304 that may form a second capacitor 110. This interweaving stack 300 may be referred to as a 3×3 interweaving stack. In a 3×3 interweaving stack, a stack 302 of electrodes of first capacitor 104 may be formed by three electrodes 206, each one disposed between two electrodes 204, and a stack 304 of electrodes of the second capacitor 110 may be formed by three electrodes 210, each one disposed between two electrodes 208.

Figure 13:
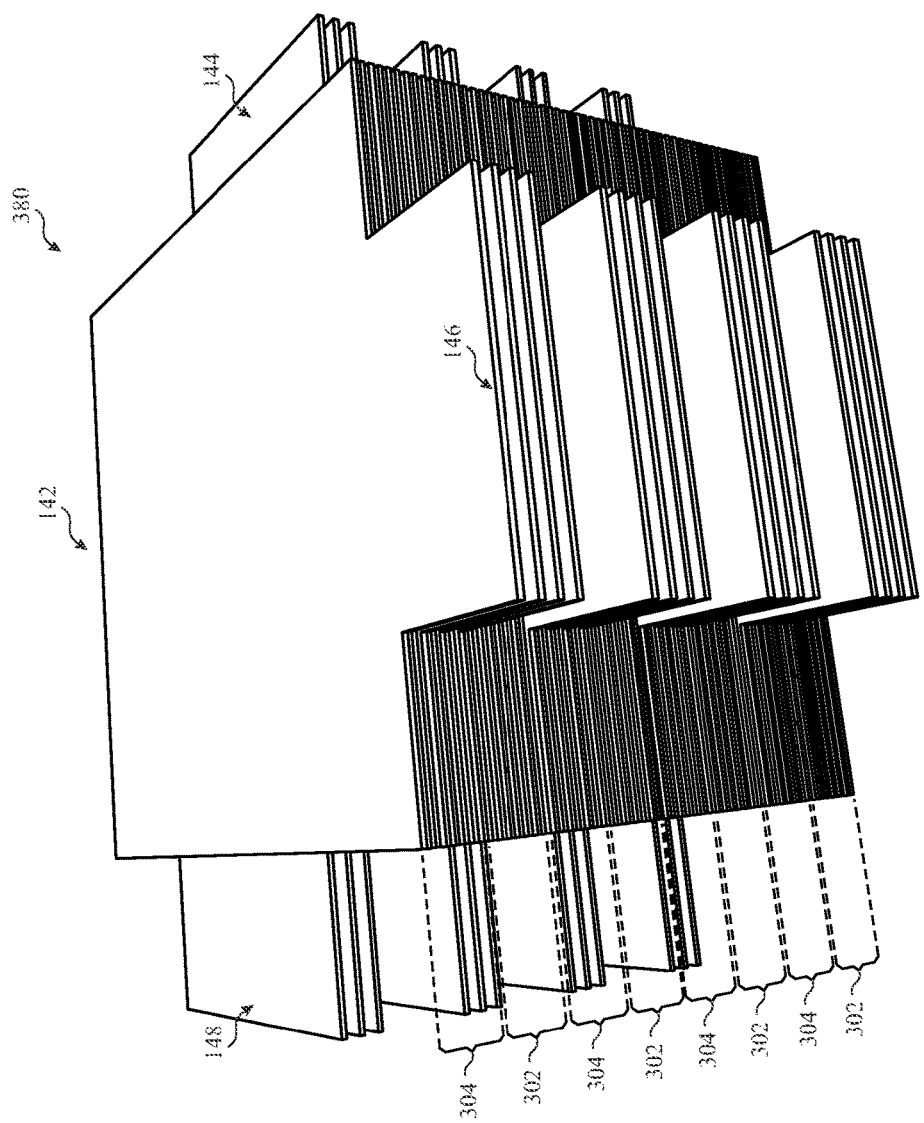
FIG. 13 is a perspective view of a stack using the alternative electrode arrangement for the matched capacitor device of FIG. 12, in accordance with an embodiment.

The diagram in FIG. 13 illustrates a stack arrangement 350 using multiple 3×3 interweaving electrode stacks 300 of FIG. 12. In the illustrated stack arrangement 350, electrodes of the second capacitor 110 (e.g., electrodes 204 and 206) are arranged in stack 304 and stacked atop electrodes of the first capacitor 104 (e.g., electrodes 210 and 208), which are arranged in the stack 302. Stack 302 is formed by the sequence of seven electrodes in the order 210, 208, 210, 208, 210, 208, and 210 and stack 304 is formed by the sequence of seven electrodes in the order 204, 206, 204, 206, 204, 206, and 204. Stack arrangement 350 shows 4 interweaving stacks 300 placed in the order above described. Note that in this 3×3 interweaving stack arrangement, for each capacitive interface between electrodes 204 and 208, of parasitic capacitance 116, there may be six capacitive interfaces between electrodes 204 and 206 of the second capacitor 110 and 6 capacitive interfaces between electrodes 208 and 210 of the first capacitor 104. Accordingly, a stack arrangement 350 may provide a dual matching capacitor device 160 having a parasitic capacitance 116 as large as one sixth of the capacitance of capacitors 104 and 110.

Figure 14:
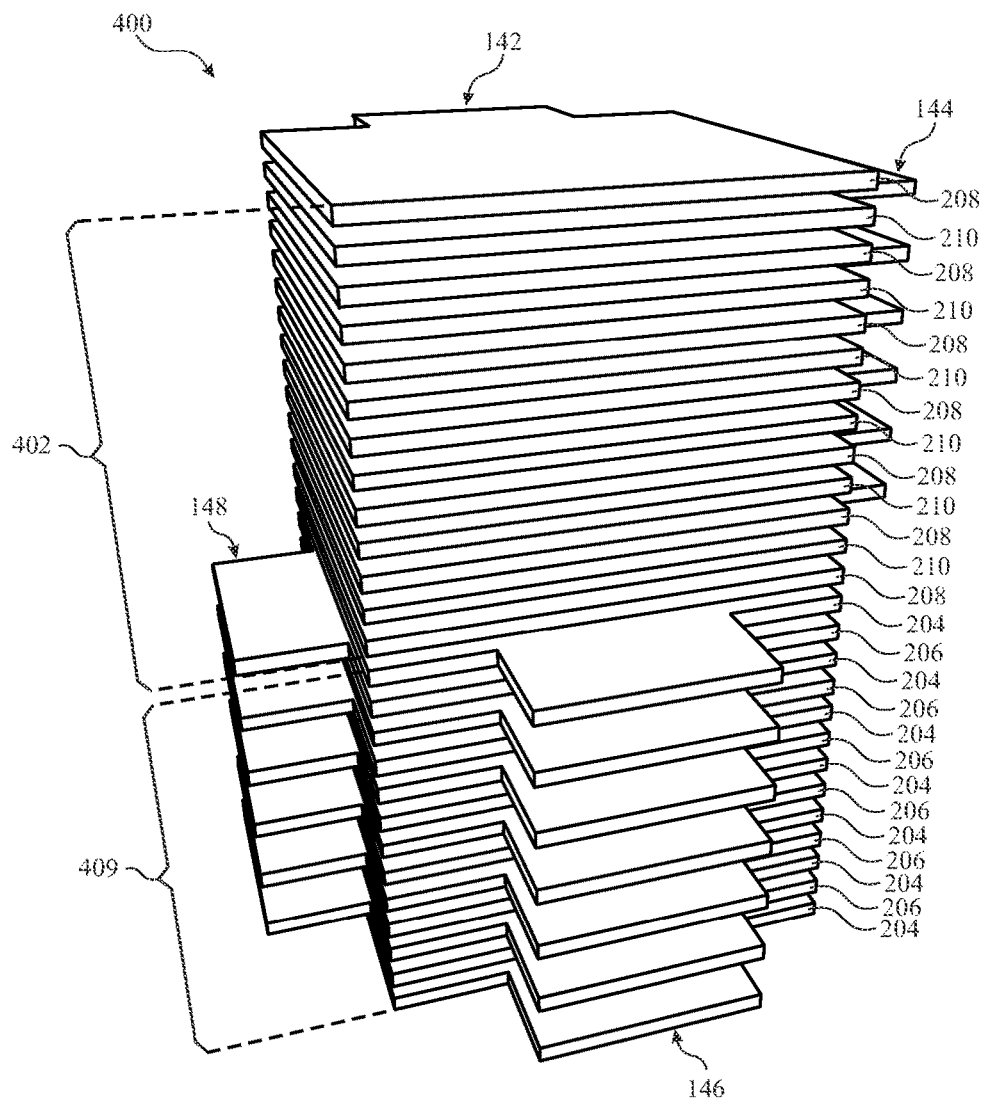
FIG. 14 is a exploded perspective view of an alternative electrode arrangement for the matched capacitor device of FIG. 9A, in accordance with an embodiment.

The diagram in FIG. 14 illustrates an alternative interweaving stack 400 that may be used to assemble a dual matched capacitor 160 with further reduced parasitic capacitance. Interweaving stack 400 may have a first stack 402 that may be coupled to terminals of a first capacitor 104, and a second stack 404 that may be coupled to terminals of a second capacitor 110. Interweaving stack 400 may be referred to as a 6×6 interweaving stack. In a 6×6 interweaving stack, the first stack 402 may be formed by six electrodes 210, each electrode 210 disposed between two electrodes 208, and the second stack 404 may be formed by six electrodes 206, each electrode 206 disposed between two electrodes 204.

Figure 15:
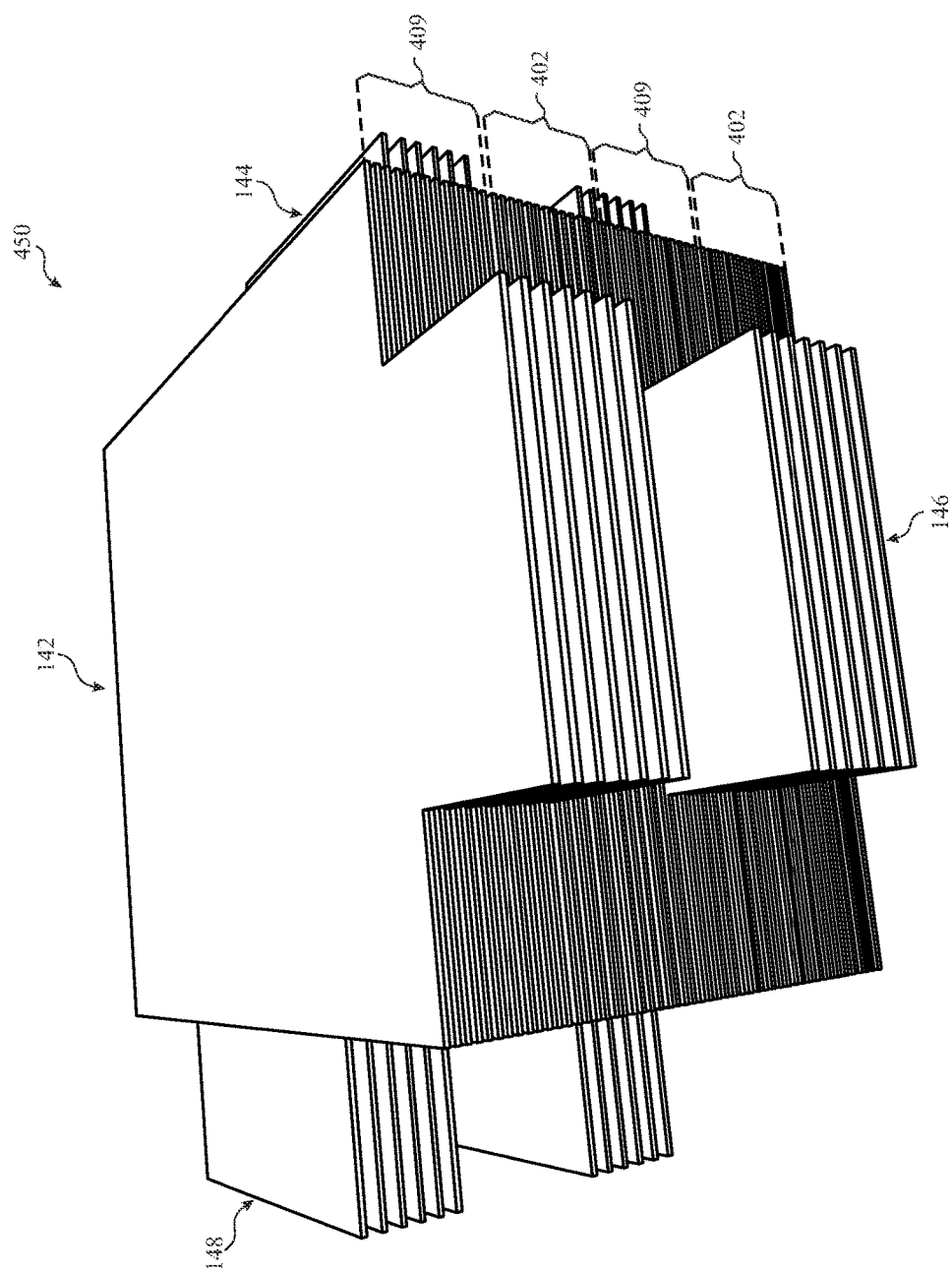
FIG. 15 is a perspective view of a stack using the alternative electrode arrangement for the matched capacitor device of FIG. 14, in accordance with an embodiment.

The diagram in FIG. 15 illustrates a stack arrangement 450 that may use two 6×6 interweaving stacks 400 of FIG. 14. In the illustrated stack arrangement 450, electrodes of the second capacitor 110 (e.g., electrode 204 and 206) are arranged in second stack 404 and placed atop a first stack 402 having electrodes of the second capacitor (e.g., electrodes 208 and 210). The first stack 402 is formed by the sequence of 13 electrodes in the order 204, 206, 204, 206, 204, 206, 204, 206, 204, 206, 204, 206, and 204. The second stack 404 is formed by the sequence of 13 electrodes in the order 208, 210, 208, 210, 208, 210, 208, 210, 208, 210, 208, 210, and 208. Stack arrangement 450 has two interweaving stacks 400 using the order above described. Note that in the 6×6 interweaving stack arrangement, for each capacitive interface between electrodes 204 and 208 of parasitic capacitance 116, there may be 12 capacitive interfaces between electrodes 204 and 206 of the second capacitor 110 and 12 capacitive interfaces between electrodes 208 and 210 of the first capacitor 104. Accordingly, stack arrangement 450 may be used to build a dual matching capacitor device 160 having a parasitic capacitance 116 limited to one twelfth of the capacitance of capacitors 104 and 110.

Figure 16:
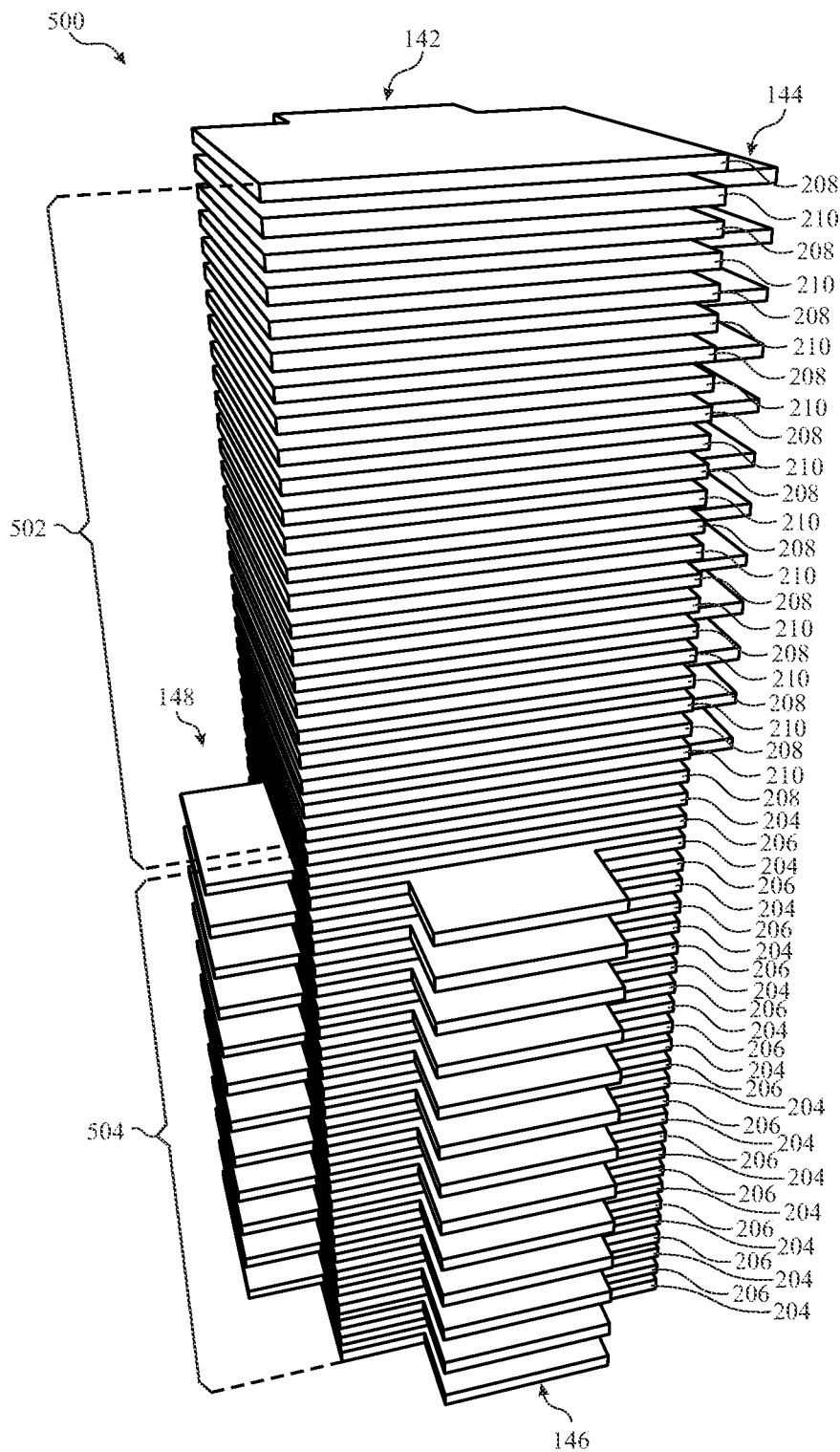
FIG. 16 is a exploded perspective view of an alternative electrode arrangement for the matched capacitor device of FIG. 9A, in accordance with an embodiment.

The diagrams in FIG. 16 illustrated another interweaving stack 500 that may be used to assemble a dual matched capacitor 160. Electrode stack 500 may have a first stack 502 that may be coupled to terminals of a first capacitor 104, and a second stack 404 that may be coupled to terminals of a second capacitor 110. Interweaving stack 500 may be referred to as a 12×12 stack. In a 12×12 stack, a first stack 502 having 12 electrodes 210, each electrode 210 disposed between two electrodes 208, is placed atop a second stack 504 having 12 electrodes 206, each electrode 206 disposed between two electrodes 204.

Figure 17:
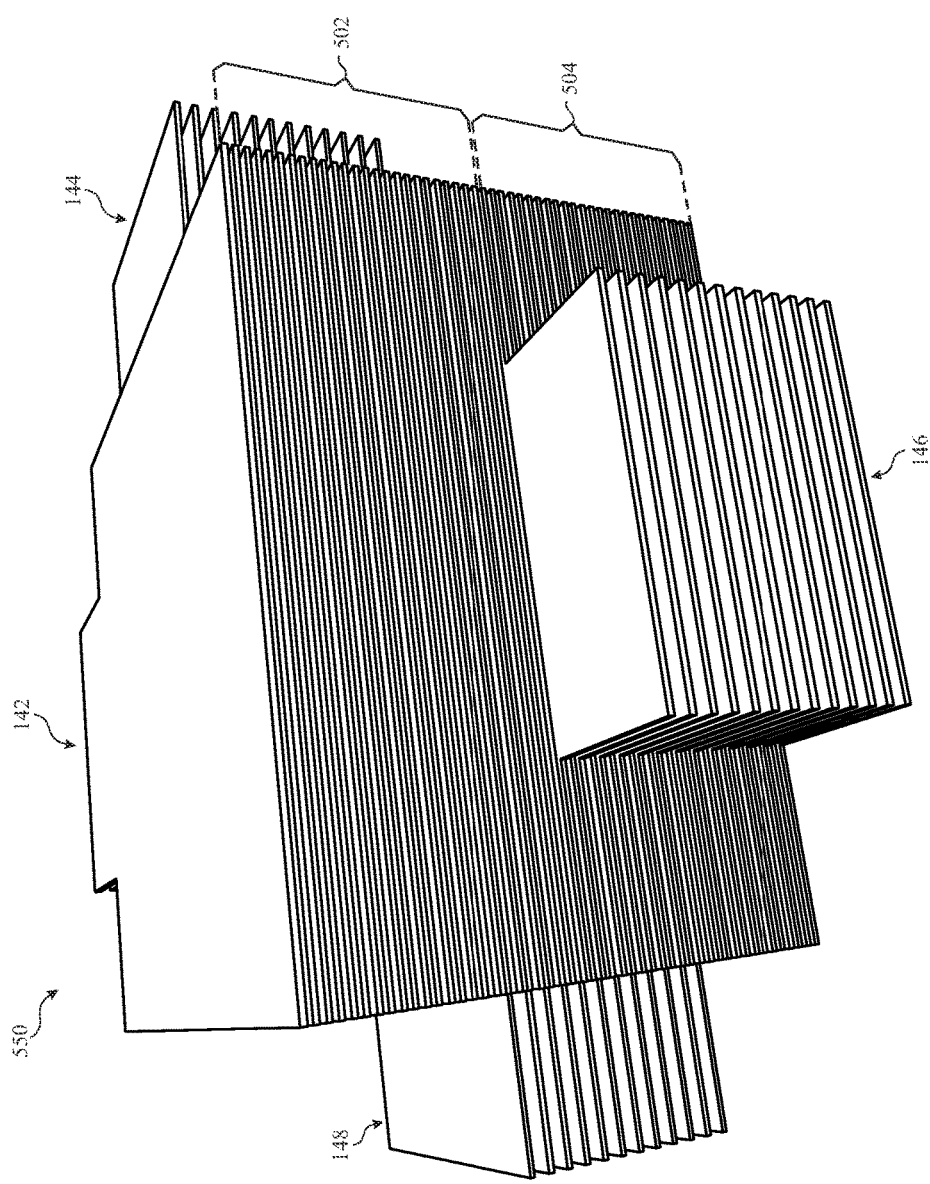
FIG. 17 is a perspective view of a stack using the alternative electrode arrangement for the matched capacitor device of FIG. 16, in accordance with an embodiment.

The diagram in FIG. 17 illustrates a stack arrangement 550 that may be used to form the dual matched capacitor. In the illustrated stack arrangement 550, electrodes of the first capacitor (e.g., electrodes 208 and 210) are arranged in a first stack 502 and placed atop electrodes of the second capacitor (e.g., electrodes 208 and 210) arranged in a second stack 504. The first sequence 502 of electrodes is formed by a sequence of 25 electrodes in the order 208, 210, 208, 210, 208, 210, 208, 210, 208, 210, 208, 210, 208, 210, 208, 210, 208, 210, 208, 210, 208, 210, 208, 210, and 208. The sequence 504 of electrodes is formed by a sequence of 25 electrodes in the order 204, 206, 204, 206, 204, 206, 204, 206, 204, 206, 204, 206, 204, 206, 204, 206, 204, 206, 204, 206, 204, 206, 204, 206, and 204. Stack arrangement 450 has an interweaving stack 500 using the order above described. A stack arrangement may employ multiple interweaving stacks 500. Note that in a 12×12 interweaving stack arrangement, for each capacitive interface between electrodes 204 and 208 of parasitic capacitance 116, there may be 24 capacitive interfaces between electrodes 204 and 206 of the second capacitor 110 and 24 capacitive interfaces between electrodes 208 and 210 of the first capacitor 104. Accordingly, stack arrangement 450 may be used to build a dual matching capacitor device 160 having a parasitic capacitance 116 limited to 1/24th of the capacitance of capacitors 104 and 110.

When compared to a capacitor employing a 1×1 interweaving stack 202, such as stack arrangement 250, stack arrangement 550 using 12×12 interweaving stack 500 may lead to a capacitor with smaller parasitic capacitance. Note, however, that in stack arrangement 550, some electrodes of the first capacitor 104 may be several layers separated from the electrodes of the second capacitor 110. In contrast, in stack arrangement 250, an electrode of the first capacitor 104 is separated from an electrode of the second capacitor by, at most, one layer. The reduced distance between the electrodes from the two different capacitors in the 1×1 interweaving stack 202 may increase the correlation between variations to electrical properties of the capacitors. As a result, the specific interweaving arrangement to assemble a capacitor may be determined based on a tradeoff between parasitic capacitance 116 and reliability of the matching between the capacitors.

Interweaving stacks of different types may be used to produce a monolithic matched capacitor device. For example, the matched capacitor 600 of FIG. 18 may be assembled to have a two 1×1 interweaved stacks 602 and 604 and a single 3×3 interweaved stack 606. The use of multiple stack types may allow low parasitic capacitance 116 while still mitigating mismatches in regions where physical alterations to matched capacitor 600 are likely. In the example of matched capacitor 600, the four regions 610 located at the edges of the body may be regions that are likely to suffer physical damage.

In the illustration, regions 610 may be substantially deformed from a right angle, showing a curve due to damages during fabrication, assembly, transport, or wear. The physical changes to regions 610 may lead to physical alterations to electrodes near the bottom 612 or the top 614 of capacitor 600. These damages may differentially affect the capacitances of the two capacitors of the matched capacitor device 600. To mitigate problems due to physical variations in regions 610, multiple types of interweaved stacks in different regions may be employed. In regions 602 and 604 near the top 614 and bottom 612, respectively, a 1×1 interweaved stack may be used to preserve the correlation between first and second capacitors, by having electrodes of both capacitors located in close proximity. In region 606, along the body of capacitor 600, physical alterations are less likely and a 3×3 interweaved stack may be used to reduce parasitic capacitances. Other stacks, such as 2×2, 4×4, 6×6, 7×7, 8×8, 9×9, 10×10, 11×11, or 12×12 may be employed in region 606. It should be noted that capacitor 600 is not limited to two different interweaved stacks in three regions 602, 604, and 606 and may include more regions having more than two types of stacks.

Figure 19A:
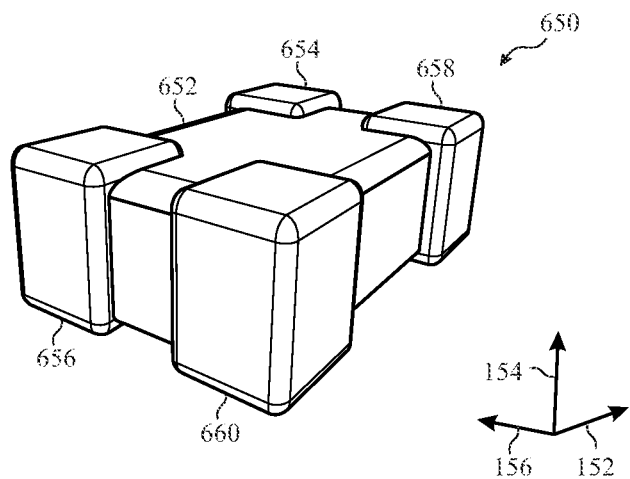
FIG. 19A is a perspective view of an alternative embodiment for a matched capacitor device which may be included in the electronic device of FIG. 1, in accordance with an embodiment.
Figure 19B:
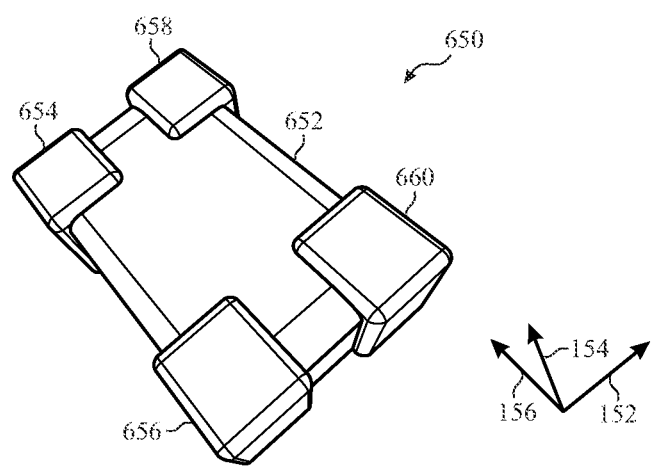
FIG. 19B is an alternative perspective view of the matched capacitor device of FIG. 19A, in accordance with an embodiment.
Figure 19C:
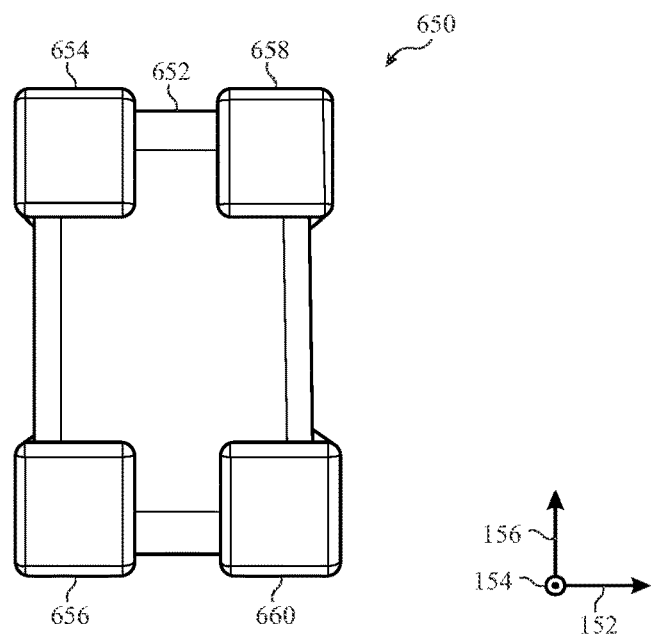
FIG. 19C is a top view of the matched capacitor device of FIG. 19A, in accordance with an embodiment.

Matched capacitor devices may also be produced using side-by-side electrode constructions, as an alternative or in conjunction with interweaved electrode design described above. FIGS. 19A, 19B, and 19C show dual capacitor devices 650 that may be produced using side-by-side electrodes. In this design, capacitor 650 may have a case 652 that encloses two capacitors. A first capacitor may be located between terminals 654 and 656, and a second capacitor may be located between terminals 658 and 660. The terminals 654, 656, 658, and 660 may be located along corner edges of the dual capacitor device 650.

Figure 20A:
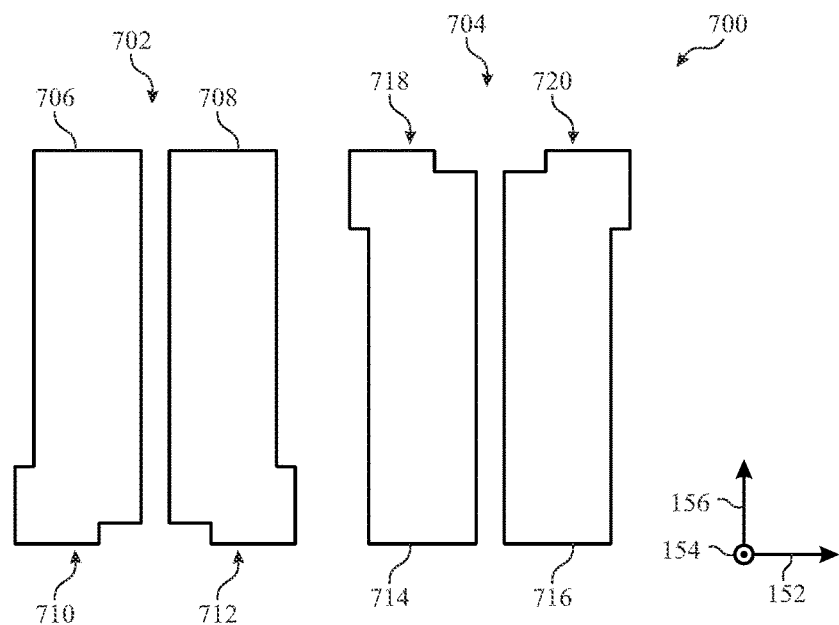
FIG. 20A is a top view of electrodes that may be used in the matched capacitor device of FIG. 19A, in accordance with an embodiment.
Figure 20B:
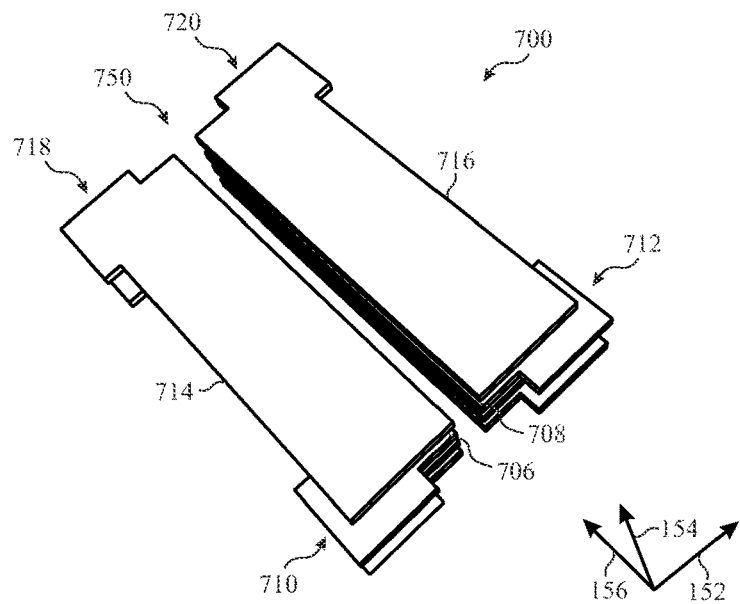
FIG. 20B is a perspective view of an arrangement of the electrodes of FIG. 20A to form the capacitor device of FIG. 19A, in accordance with an embodiment.

The diagram 700 in FIG. 20A shows a top view of two ceramic sheets 702 and 704 that may be used to assemble dual capacitor device 650. The ceramic sheet 702 may have two electrodes 706 and 708. Electrode 706 may have a tab 710 that may be used to couple to termination 656. Electrode 708 may have a tab 712 that may be used to couple to termination 660. The second ceramic sheet 704 may have two electrodes 714 and 716. Electrode 714 may have a tab 718 that may couple to electrical termination 654. Electrode 716 may have a tab 720 that may couple to electrical termination 658. To prevent parasitic capacitances between electrodes 706 and 708, and between electrodes 714 and 716, a separation between the electrodes may be employed. Separation distances may range from 5 µm to 100 µm. In some embodiments, a 50 µm separation may be used. Smaller separations may increase parasitic capacitances, while large separations may lead to reduced capacitances. Ceramic sheets 702 and 704 may be stacked to form the stack arrangement 750 of FIG. 20B. In this stack arrangement, the capacitive coupling between electrodes 706 and 714 form a first capacitor between terminals 654 and 656, and the capacitive coupling between electrodes 708 and 716 may form a second capacitor between terminals 658 and 660. To that end, ceramic sheets 702 and 704 should be arranges such that electrode 706 is aligned above electrode 714, and electrode 708 is aligned above electrode 716.

Figure 21A:
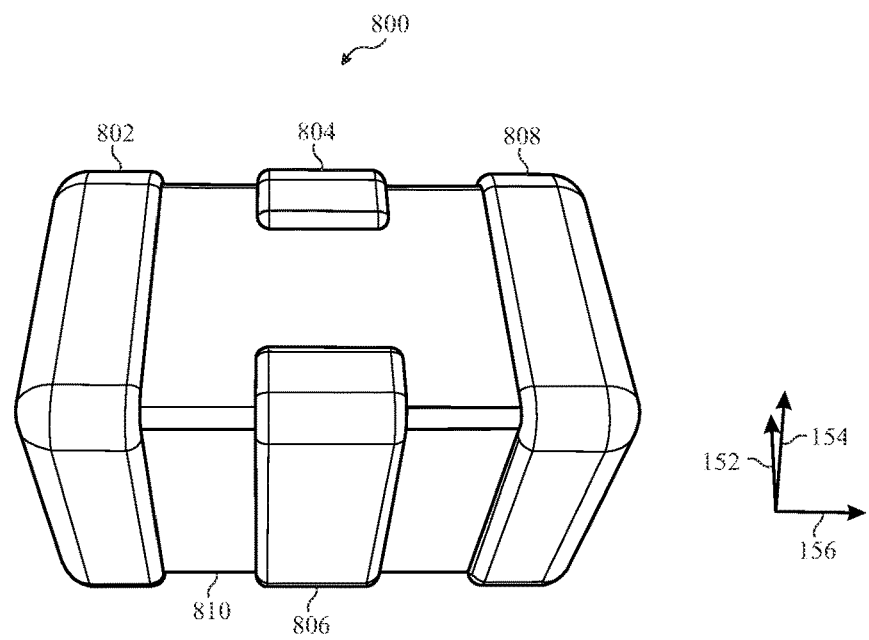
FIG. 21A is a perspective view of an alternative embodiment for a matched capacitor device which may be included in the electronic device of FIG. 1, in accordance with an embodiment.
Figure 21B:
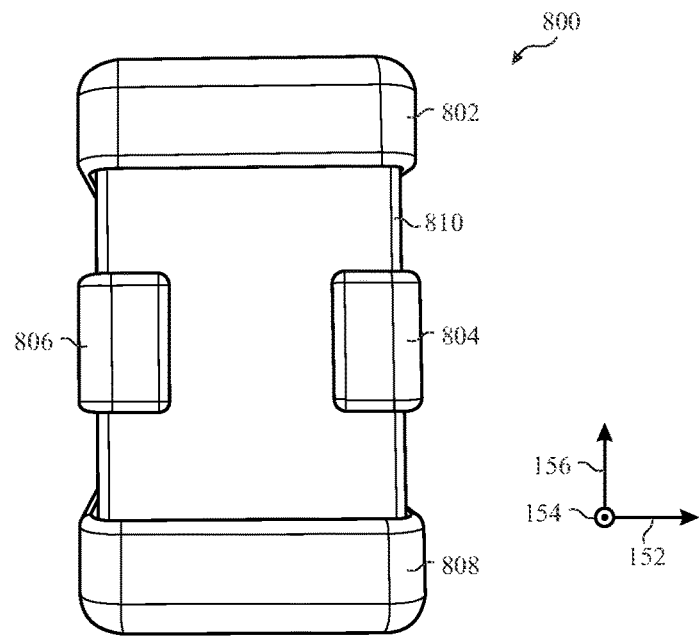
FIG. 21B is a top view of the matched capacitor device of FIG. 21A, in accordance with an embodiment.
Figure 22A:
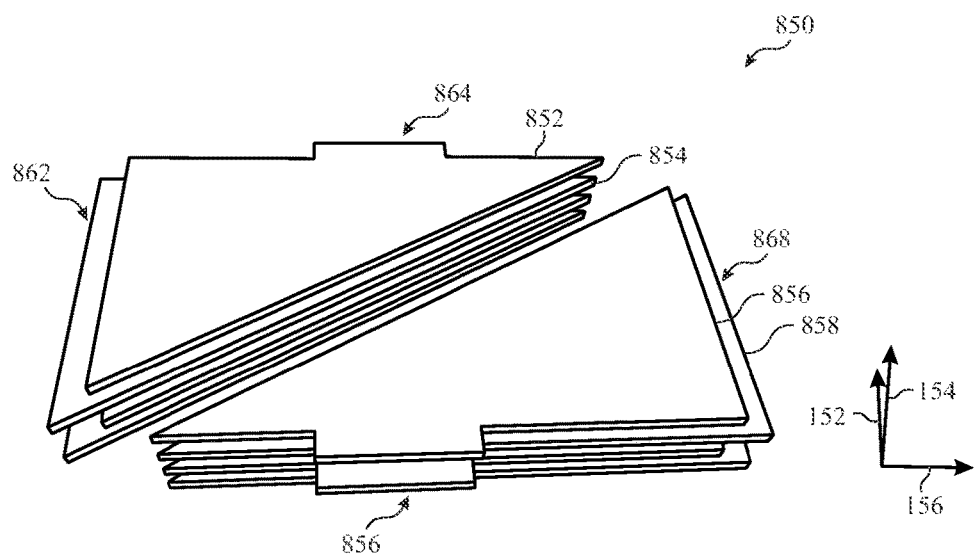
FIG. 22A is a perspective view of an arrangement of electrodes to form the matched capacitor device of FIG. 21A, in accordance with an embodiment.
Figure 22B:
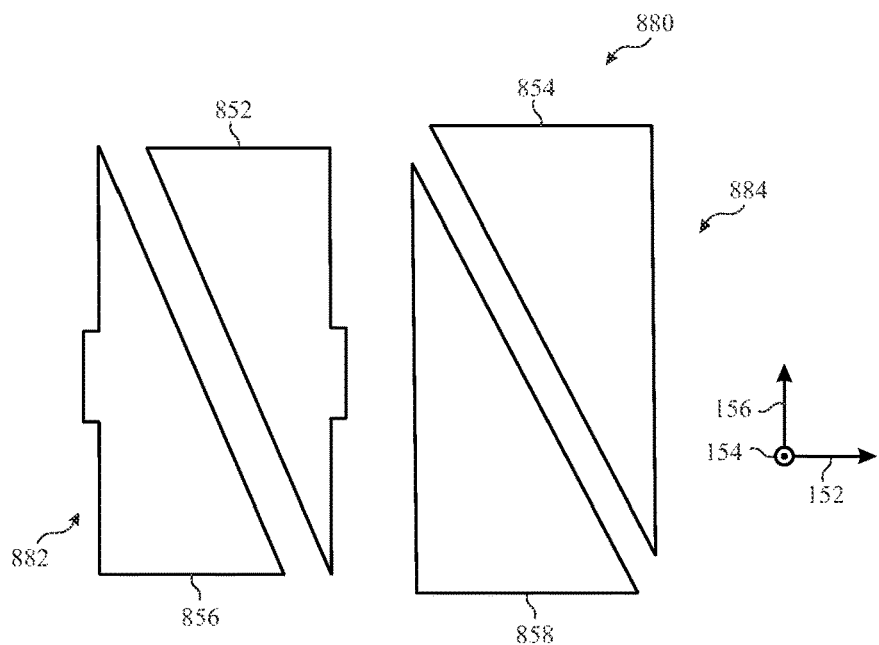
FIG. 22B is a top view of electrodes that may be used to form the matched capacitor device of FIG. 21A, in accordance with an embodiment.

FIGS. 21A and 21B provide a perspective and a top view of another design for a dual capacitor device 800. The dual capacitor device 800 may have a first capacitor between terminations 802 and 804 and a second capacitor between terminations 806 and 808. Terminations 802 and 808 may be located at ends of the case 810 of the dual capacitor device 800, while terminations 804 and 806 may be located in the middle of side faces of the case 810. The stack arrangement 850 illustrates a possible organization for the dual capacitor device 800. The capacitive interfaces between electrode 852 and electrode 854 may form the first capacitor between terminations 802 and 804 while the capacitive interfaces between electrode 856 and 858 may form the second capacitor between terminations 806 and 808. To couple the electrode to terminations, electrode 852 may have a tab 862 that couples to termination 802, electrode 854 may have a tab 864 that couples to termination 804, electrode 856 may have a tab 866 that couples to termination 806, and electrode 858 may have a tab 868 that couples to termination 808. The top view 880 in FIG. 22B illustrates a design for ceramic sheets 882 and 884 that may be used to produce electrodes to assemble stack arrangement 850. To form the capacitive coupling described above, ceramic sheet 882 may be placed above ceramic sheet 884 such that electrode 852 is aligned above electrode 854 and electrode 856 is aligned above electrode 858.

In the dual capacitors described above, the interweaving between electrodes of different capacitors may lead to the appearance of a parasitic capacitance 116 between terminals of two different capacitors, as illustrated in FIG. 7 above. In order to reduce the presence of parasitic capacitance between layers, a shield layer may be placed between electrodes of two different capacitors. The electrical diagram 900 of a dual matched capacitor 902 illustrates the embodiment. The first capacitor 104 may be separated from the second capacitor 110 by a shield layer 904 that may be connected to a ground 906. The presence of a shield layer 904 may lead to a parasitic capacitance 908 between the terminal 106 and the ground 906, and a second parasitic capacitance 910 between terminal 112 and the ground 906. These parasitic capacitances 908 and 910 may be more manageable than the parasitic capacitance 116 of FIG. 7, as the two capacitors 104 and 110 become decoupled from each other.

Figure 24:
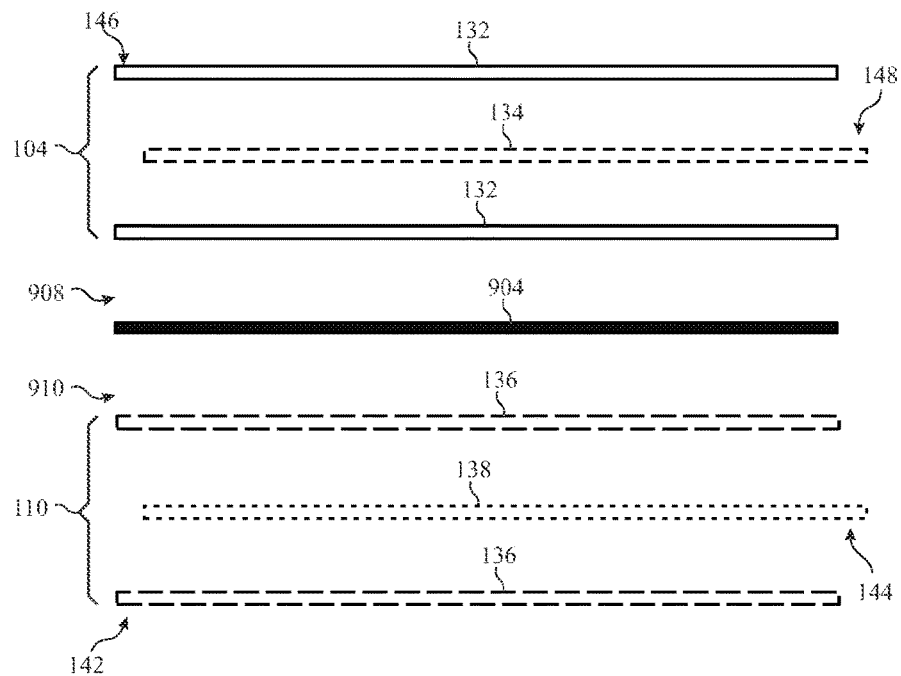
FIG. 24 is a schematic diagram of electrode arrangements for the matched capacitor device of FIG. 23, in accordance with an embodiment.

The schematic electrode arrangement in FIG. 24 illustrates a layout for a dual capacitor device 902 with a shield layer 904. The dual capacitor device 902 may have a first capacitor 104 formed with electrodes 132 and 134 and a second capacitor formed with electrodes 136 and 138. Electrode 132 may be coupled to a termination through a tab 146, electrode 134 may be coupled to a termination through a tab 148, electrode 136 may be coupled to a termination through a tab 142, and electrode 138 may be coupled to a termination through a tab 144. Shield layer 904 may be placed between electrodes 132 and 136, forming two capacitive couplings. The capacitive coupling between shield layer 904 and electrode 132 may lead to the first parasitic capacitance 908 and the capacitive coupling between shield layer 904 and electrode 136 may lead to the second parasitic capacitance 910.

Figure 25A:
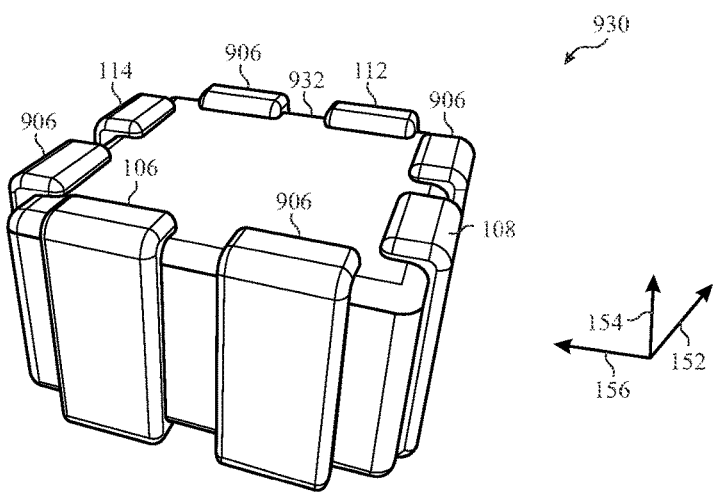
FIG. 25A is a perspective view of an embodiment for the matched capacitor device with a shielding layer of FIG. 23, in accordance with an embodiment.
Figure 25B:
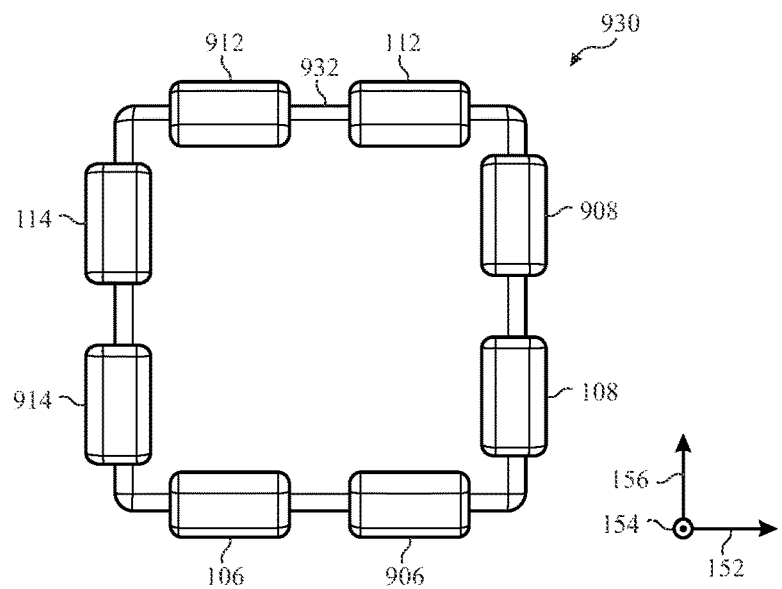
FIG. 25B is a top view of the embodiment for the matched capacitor device with a shielding layer of FIG. 25A, in accordance with an embodiment.
Figure 25C:
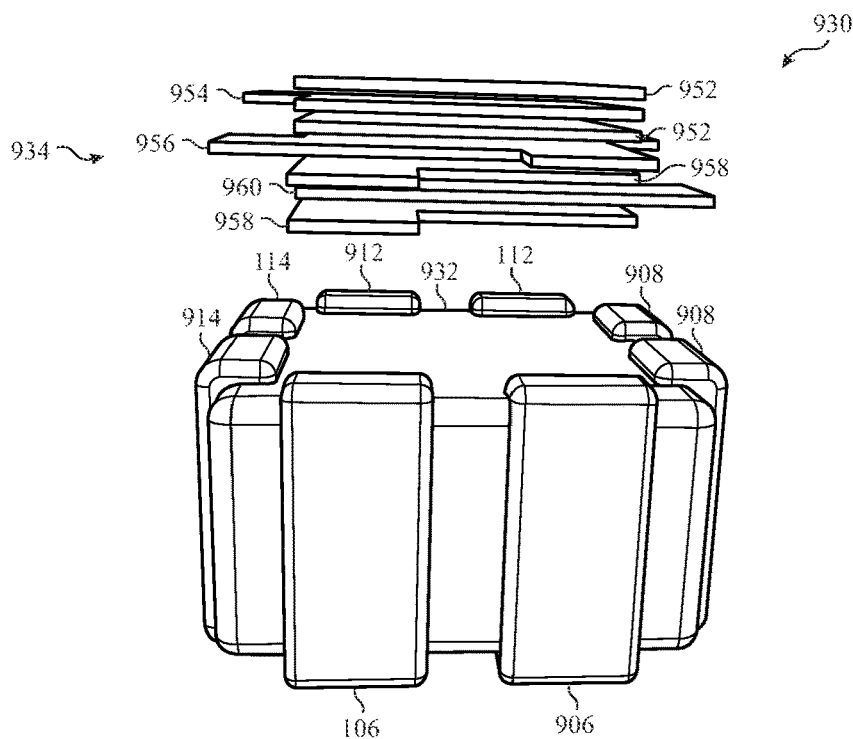
FIG. 25C is a perspective view of an embodiment for the matched capacitor device with a shielding layer of FIG. 25A with an exploded view of an electrode arrangement, in accordance with an embodiment.

FIGS. 25A and 25B illustrate a perspective and a top view of a dual capacitor device 930 having a shield layer. The capacitor device 930 may have a case 932 with terminations 106 and 108 for the first capacitor, terminations 112 and 114 for the second capacitor, and terminations 906 for the shield layer. These terminations may be placed along the sides of the capacitor, with a shield layer termination and a capacitor termination in each side. FIG. 25C illustrates a front perspective of the dual capacitor device 930 with a stack arrangement 934. The stack arrangement 934 may be placed within case 932 and the illustration is provided to show the relative orientation of the electrodes with respect to the termination of dual capacitor device 932. The stack arrangement may have a 1×1 sequence formed by electrodes 952, 954, and 952 of the first capacitor 104. This sequence is stacked atop a shield layer 956. Below the shield layer, a second 1×1 sequence formed by electrodes 956, 958, and 956 is placed. Other stack arrangements 934 may be place below the first stack arrangement, as illustrated below in the embodiments without a shield layer.

Figure 26:
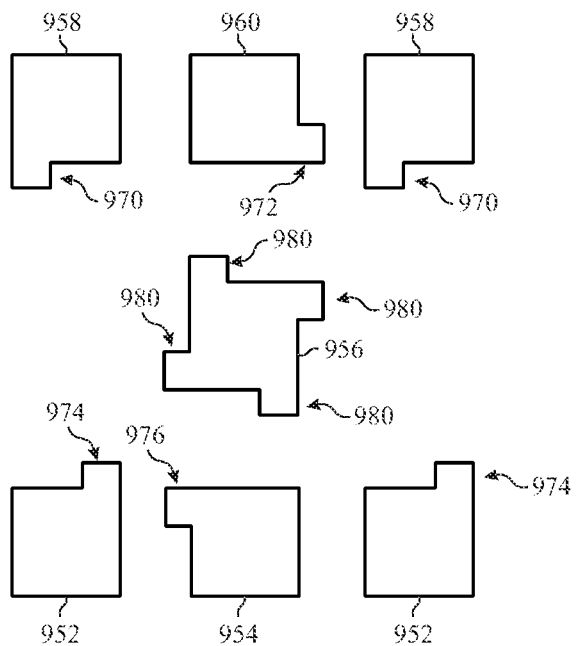
FIG. 26 illustrates a set of electrodes that may be used in the matched capacitor device with a shielding layer of FIG. 25A, in accordance with an embodiment.

FIG. 26 presents a top view of the layout of electrodes used to form the dual capacitor device 932. In this design, electrodes 958 may have tabs 106 that couple to termination 106 and electrode 960 may have tabs 972 that couples to termination 108, forming the first capacitor 104. Similarly, electrodes 952 may have tabs 974 that couple to termination 112 and electrode 954 may have a tab 976 that couples to termination 114. Each shield layer 956 may have four tabs 980, which may couple to electrical terminations 906. Note that shield layer 956 may be an equilateral layer (e.g., has quadrilateral symmetry), which may lead to more effective shielding properties.

Figure 27:
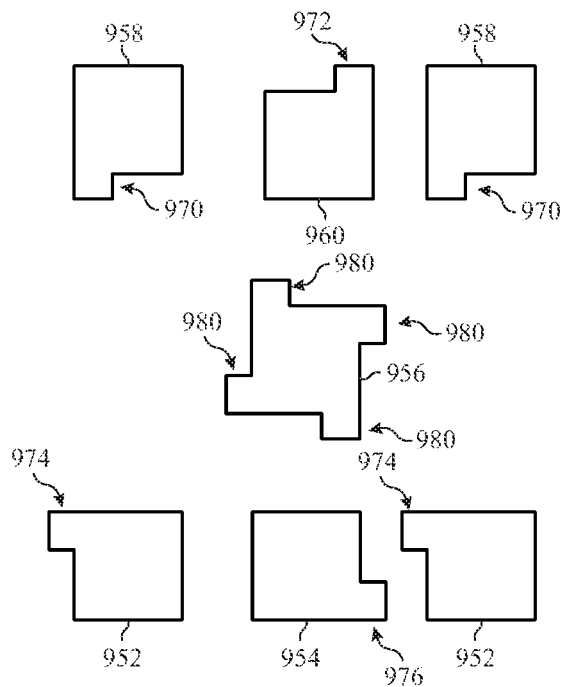
FIG. 27 illustrates an alternative set of electrodes that may be used in the matched capacitor device with a shielding layer of FIG. 25A, in accordance with an embodiment.
Figure 28:
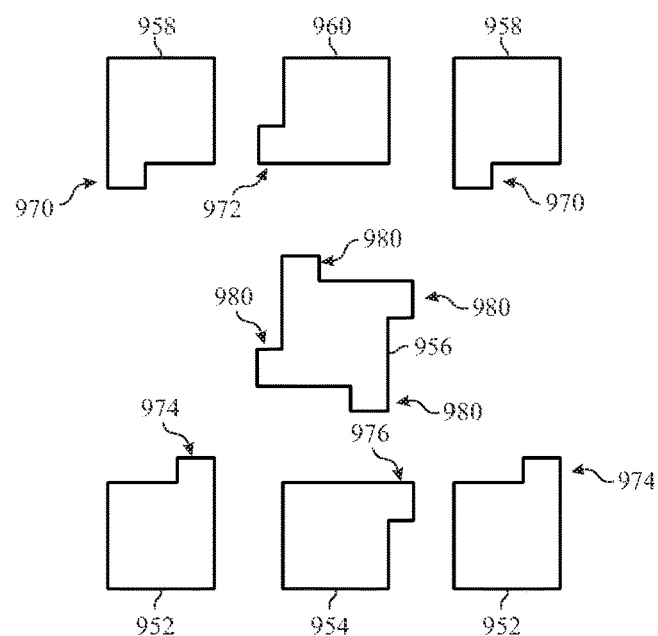
FIG. 28 illustrates an alternative set of electrodes that may be used in the matched capacitor device with a shielding layer of FIG. 25A, in accordance with an embodiment.
Figure 29:
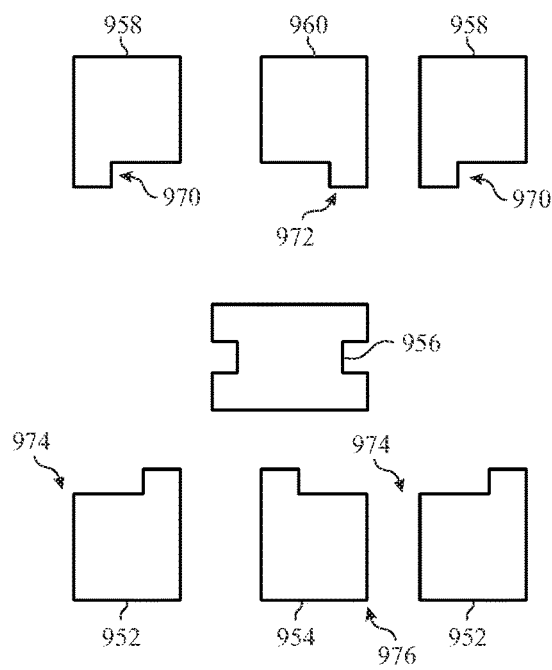
FIG. 29 illustrates an alternative set of electrodes that may be used in the matched capacitor device with a shielding layer of FIG. 25A, in accordance with an embodiment.

The diagrams in FIGS. 27, 28, and 29 illustrate alternative shapes for electrodes 952, 954, 958, and 960 and shield layer 956 that may be used with a device similar to the dual matched capacitor 930. Note that in these designs the terminations 106, 108, 112, 114, 906, 908, 912, and 914 may perform a different role. In FIG. 27, the first capacitor 104 may be formed by electrodes 958 and 960. Tab 970 of electrode 958 may couple to termination 106, while tab 972 of electrode 960 may couple to electrode 112, resulting in the first capacitor 104 formed between terminations 106 and 112. The second capacitor 110 may be formed by electrodes 952 and 954. Tab 974 of electrode 952 may couple to termination 114, while tab 976 of electrode 954 may couple to termination 108. The terminations 980 in shield layer 956 may couple to terminations 906, 908, 912, and 914. Both layouts in FIGS. 26 and 27 may present a more efficient shield layer configuration due to its equilateral design. Note that the layout of FIG. 27 may present a higher self-inductance than the layout of FIG. 26 because electrode terminations for each capacitor of the dual capacitor device in FIG. 27 are located in opposite sides, while in terminations for each capacitor of the dual capacitor device in FIG. 26 are separated by a reduced distance.

The electrode layout in FIG. 28 may be used to form a dual capacitor device with reduced inductances by further reducing the distance between the terminations of each capacitor. The first capacitor 104 may be formed by electrodes 958 and 960. Tab 970 of electrode 958 may couple to electrode 106, while tab 972 of electrode 960 may couple to electrode 914, resulting in the first capacitor 104 formed between terminations 106 and 914. The second capacitor 110 may be formed by electrodes 952 and 954. Tab 974 of electrode 952 may couple to termination 112, while tab 976 of electrode 954 may couple to termination 908. The terminations 980 in the shield layer 956 may couple to terminations 108, 114, 906, and 912. Note that the terminations 106 and 914 for the first capacitor 104 and terminations 112 and 908 of the second capacitor 110 are in adjacent sides of the dual capacitor device and in close proximity, which may lead to a reduction in self-inductance. Note however that the shield layer 956 is not equilateral, which may decrease the shield performance.

The electrode layout in FIG. 29 illustrates another dual capacitor device with reduced inductances. In this device, the reduced inductances may be achieved by placing the terminations of each capacitor device in a same side. The first capacitor 104 may be formed by electrodes 958 and 960. Tab 970 of electrode 958 may couple to termination 106 and tab 972 of electrode 960 may couple to termination 906. The second capacitor 110 may be formed by electrodes 952 and 954. Tab 974 of electrode 952 may couple to termination 112, while tab 976 of electrode 954 may couple to termination 912. For both capacitors 104 and 110, the respective electrical terminations are located in the same side (e.g., electrical terminations 106 and 906 of the first capacitor 104 are in the same side and electrical terminations 112 and 912 of the second capacitor 110 are in the opposite side). The shield layer 956 in the layout of FIG. 29 may have tabs 980 that couple to terminations 108, 114, 908, and 914, and each pair of electrical terminations of the shield may be located in the same side (e.g., electrical terminations 108 and 908 are in the same side and electrical terminations 114 and 914 are in the opposite side).

Figure 30:
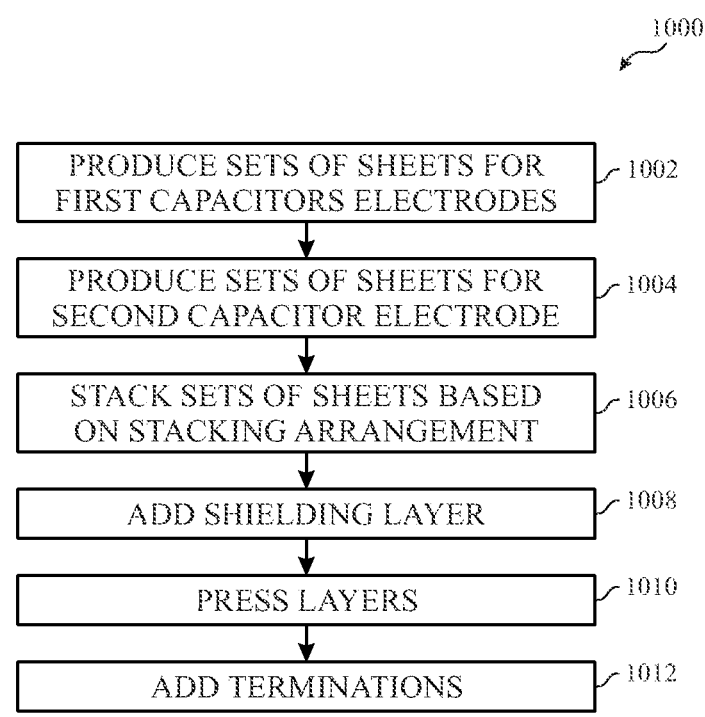
FIG. 30 illustrates a method to produce a matched capacitor device that can be used in the electronic device of FIG. 1, in accordance with an embodiment.

The capacitor devices described above may be produced employing a method 1000 for fabrication of a matched capacitor devices from ceramic sheets, illustrated in FIG. 30. The method 1000 may include a process 1002 to produce sets of ceramic sheets having electrodes associated to a first capacitor and a process 1004 to produce sets of ceramic sheets having electrodes associated to the second capacitor of the device. Production of a sheet in processes 1002 and 1004 may include processes to stencil regions in the surface of ceramic sheet with a conductive material to form electrodes. Processes 1002 and 1004 may also include processes for cutting the ceramic sheets in the appropriate dimensions for assembly in the dual matched capacitor device. In some embodiments, processes 1002 and 1004 may include production of two sets of sheets each having square shaped electrodes and a tab to couple to the electrical terminations of the dual capacitor. Examples of shapes the layout for electrodes include electrodes 204, 206, 208, and 210 of FIG. 10, and the layouts illustrated in FIGS. 26, 27, 28, and 29. In some embodiments, processes 1002 and 1004 may be carried simultaneously, such as in the production of capacitors having side-by-side electrodes. In such embodiments, processes 1002 and 1004 may lead to a production of two sets of sheets, in which each sheet has one electrode associated to the first capacitor and one electrode associated to the second capacitor. Examples of these layouts are illustrated in FIGS. 20A and 22B.

Ceramic sheets for the processes described above may be produced from any ceramic materials used to produce multilayer ceramic capacitors. A non-exhaustive list of materials may include titanium dioxide or barium titanate that may or may not be doped, and may have additives such as a zinc, zirconium, magnesium, cobalt, any number of silicates, and/or any number of oxides. In embodiments that produce class 2 capacitors, type 2 materials such as X5R or other low dielectric constant, or DK (e.g., DK<2500) may be used. The conductive materials employed in the stenciling process may be copper, nickel, silver, a copper alloy, a nickel alloy, a silver alloy, or any other appropriate material.

Figure 18:
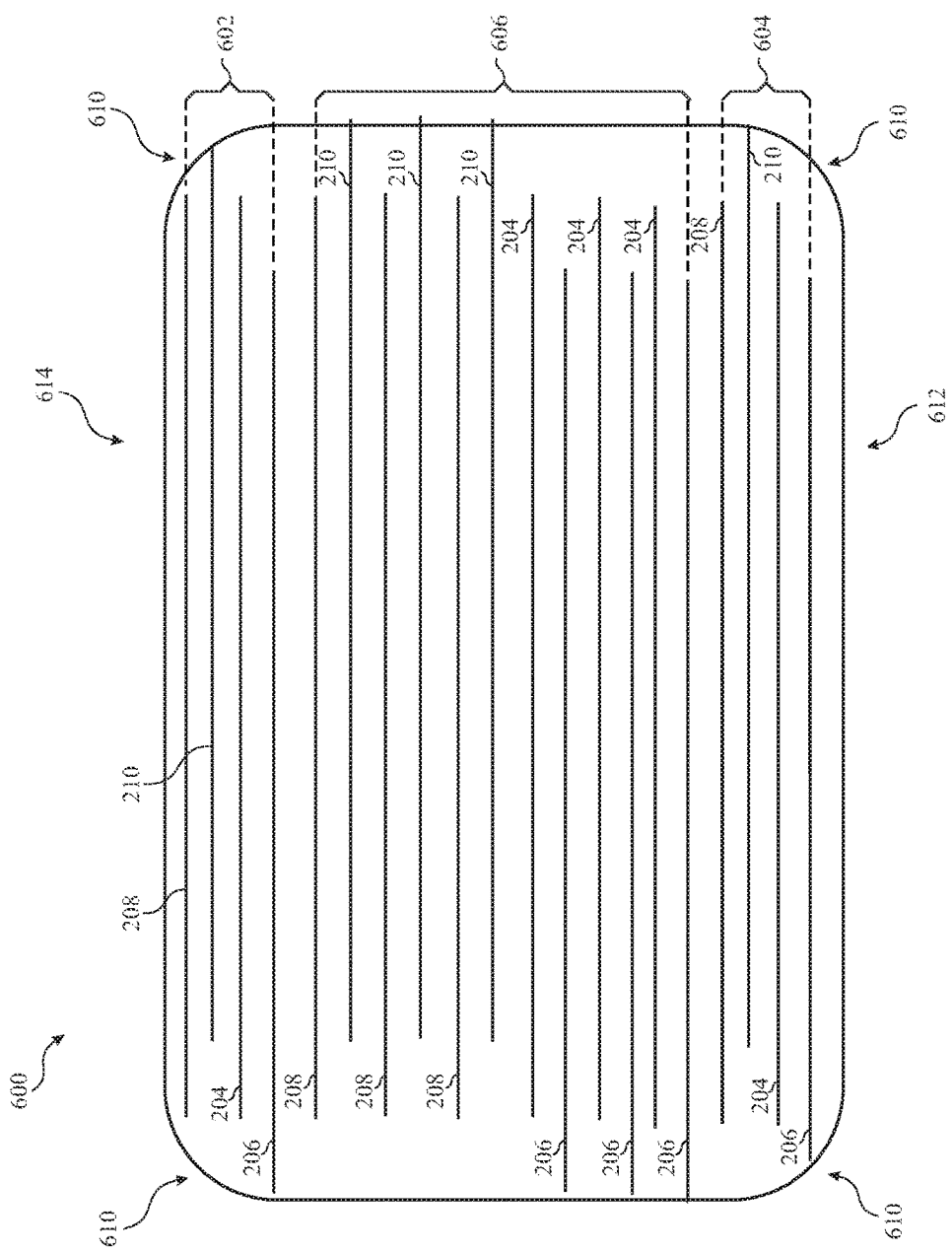
FIG. 18 is an schematic diagram of a matched capacitor device with multiple stack arrangements, and may be included in the electronic device of FIG. 1, in accordance with an embodiment.

Sheets produced by processes 1002 and 1004 may then be arranged in a stack (process 1006). Stacks may be arranged to form a 1×1 stack, a 3×3 stack, a 6×6 stack, or a 12×12 stack as illustrated in FIGS. 10, 12, 14, and 16 respectively. Note that other stack arrangements may be formed to produce a dual capacitor device. For example, an "N×N" stack may be formed by interweaving "N" electrodes with a first layout in a first capacitor with "N+1" electrodes with a second layout of the first capacitor. This may result in a stack in which each of the "N" electrodes of the first capacitor is surrounded by two other electrodes of the same capacitor. Stacks from the two capacitors may be placed atop each other. Note that different stack arrangements may also be used, as illustrated in FIG. 18. In embodiments such as the ones illustrated in FIGS. 19 and 21, processes 1002 and 1004 may produce two sets of sheets, which may be interweaved in process 1006.

A shielding layer may also be produced and placed (process 1008) between stacks of different capacitors to mitigate potential parasitic capacitances between the two capacitors of the capacitor device. To produce a shielding layer, a ceramic sheet may have a conductive material stenciled in the regions, in a manner similar to the production of electrode layers. The shapes stenciled in the ceramic sheet may be, for example, a square shape with tabs for coupling with termination of the capacitor. Examples of layout for shielding layers are illustrated in FIGS. 26, 27, 28, and 29. Once the stack of ceramic sheets is arranged in the appropriate order, the sheets may be pressed to form the body of the capacitor device (process 1010). Pressing the sheets may form the desired capacitive coupling between electrodes. As noted above, the electrodes are formed by placing a conductive material on the surface of the ceramic sheets. After pressing the layers, the ceramic sheets become the dielectric material between stenciled electrodes, through which capacitive coupling is established.

The placement of the tabs for coupling electrodes and the shield layer to terminations may lead to exposed conductive regions (e.g., external electrodes) in the faces of the body of capacitor device. The external electrodes may be produced from glass frits coated with nickel, copper, tin, a nickel alloy, a copper alloy and/or a tin alloy. These regions may be coupled to metallic terminations (process 1012). Note that each metallic termination is expected to couple to a single electrode or shield layer. In some embodiments, the body of the dual matched capacitor may be placed in a case prior to the addition of metallic terminations. The case may have openings for coupling the exposed conductive regions to a metallic terminations placed in the surface of the case.

Note moreover that, while some of the embodiments described above are related to dual matched capacitors, it should be noted that monolithic devices having any even number of matched capacitors may be produced employing the methods described herein with the appropriate adjustments to the layout of the electrodes with respect to the tabs, the arrangement of the stacks, and an appropriate addition of terminations to couple to the tabs. Shield layers between the several capacitors may also be added accordingly.

The devices herein may have shapes that follow dimension standards to facilitate integration of the capacitors in the design of electrical circuits. In the embodiments with a square base, devices may follow standards for the dimension of the base, such as the EIA 015015 (0.4 mm×0.4 mm), EIA 0202 (0.5 mm×0.5 mm), EIA 0303 (0.8 mm×0.8 mm) or EIA 0404 (1.0 mm×1.0 mm). Embodiments may be produced with any heights, and may be smaller than 0.8 mm. Note that the dimensions here discussed are merely illustrative and that embodiments produced may be larger or smaller. Moreover, the devices produced may incorporate pairs of class 2 capacitors with rated capacitances ranging from 0.1 µF to 10 µF. The rated voltage range for the capacitors may be between 4V and 25V. Note that devices having larger or smaller nominal capacitances or rated voltages may be produced by adjusting the materials and the dimensions employed.

Embodiments described herein may allow for an improved performance of electrical devices having circuits that may employ pairs of matching capacitors. Electrical devices using matched capacitor structures, such as the ones described above may be more compact, as the dual matched capacitors may have large capacitances and large rated voltages with smaller dimensions. This may be a result of using dielectrics having high capacitance density (for example, dielectric constant between 200 and 14000), such as class 2 ceramic materials. Moreover, embodiments allow for more robust and reliable class 2 ceramic capacitors and, as such, may be used in high performance electrical circuitry. Since type 2 ceramic capacitors may have a broad range of variation in capacitance depending on temperature, time, and DC/AC voltage, among other parameters, monolithic matched capacitor structures may compensate such fluctuations, as the variations between the two capacitors of a structure may be more correlated.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A capacitor device comprising:
   a first capacitor comprising a first and a second electrical termination and first and second stacks of electrodes; and
   a second capacitor comprising a third and a fourth electrical termination and third and fourth stacks of electrodes, wherein the first stack is disposed atop the third stack, the third stack is disposed atop the second stack, and the second stack is disposed atop the fourth stack;
   wherein the first stack comprises:
   a first set of electrodes, each respective electrode of the first set comprising a respective tab that couples each respective electrode to the first electrical termination; and
   a second set of electrodes, each respective electrode of the second set comprising a respective tab that couples each respective electrode to the second electrical termination, wherein each electrode of the second set is disposed between two electrodes of the first set of electrodes;
   the second stack comprises:
   a third set of electrodes, each respective electrode of the third set comprising a respective tab that couples each respective electrode to the first electrical termination; and
   a fourth set of electrodes, each respective electrode of the fourth set comprising a respective tab that couples each respective electrode to the second electrical termination, wherein each electrode of the fourth set is disposed between two electrodes of the third set of electrodes;
   the third stack comprises:
   a fifth set of electrodes, each respective electrode of the fifth set comprising a respective tab that couples each respective electrode to the third electrical termination; and
   a sixth set of electrodes, each respective electrode of the sixth set comprising a respective tab that couples each respective electrode to the fourth electrical termination, wherein each electrode of the sixth set is disposed between two electrodes of the fifth set of electrodes; and
   the fourth stack comprises:
   a seventh set of electrodes, each respective electrode of the seventh set comprising a respective tab that couples each respective electrode to the third electrical termination; and
   an eighth set of electrodes, each respective electrode of the eighth set comprising a respective tab that couples each respective electrode to the fourth electrical termination, wherein each electrode of eighth set is disposed between two electrodes of the seventh set of electrodes; and
   wherein a body of the capacitor device comprises a right prism shape that comprises:
   a square base comprising a bottom of the body of the capacitor device;
   a first side comprising the first electrical termination;
   a second side distinct from the first side, comprising the second electrical termination;
   a third side distinct from the first and the second side, comprising the third electrical termination; and
   a fourth side distinct from the first, the second, and the third side, comprising the fourth electrical termination.

2. The capacitor device of claim 1, wherein the first capacitor and the second capacitor comprise a multilayer ceramic capacitor.

3. The capacitor device of claim 1, wherein the capacitor device comprises a class 2 ceramic material.

4. The capacitor device of claim 1, wherein a height of the body of the capacitor device is smaller than 0.8 mm.

5. The capacitor device of claim 1, comprising a third capacitor comprising a fifth electrical termination and a sixth electrical termination and a fourth capacitor comprising a seventh electrical termination and an eighth electrical termination, and wherein:
   the first side comprises the fifth electrical termination;
   the second side comprises either the sixth electrical termination or the seventh electrical termination;
   the third side comprises either the sixth electrical termination or the seventh electrical termination; and
   the fourth side comprises the eighth electrical termination.

6. A capacitor device comprising:
   first, second, third, and fourth stacks of electrodes, wherein the first stack of electrodes is disposed atop the second stack, the second stack is disposed atop the third stack, and the third stack is disposed atop the fourth stack;
   a first capacitor comprising a first electrical termination, a second electrical termination, the first stack of electrodes and the third stack of electrodes, wherein the first stack comprises:
   a first set of electrodes coupled to the first electrical termination; and
   a second set of electrodes coupled to the second electrical termination, wherein each electrode of the second set is disposed between two electrodes of the first set of electrodes; and wherein the third stack of electrodes comprises:
a third set of electrodes coupled to the first electrical termination; and
a fourth set of electrodes coupled to the second electrical termination, wherein each electrode of the fourth set is disposed between two electrodes of the third set of electrodes; and
a second capacitor comprising a third electrical termination, a fourth electrical termination, the second stack of electrodes and the fourth stack of electrodes, wherein the second stack of electrodes comprises:
a fifth set of electrodes coupled to the third electrical termination; and
a sixth set of electrodes coupled to the fourth electrical termination; and
wherein the fourth stack of electrodes comprises:
a seventh set of electrodes coupled to the third electrical termination; and
an eighth set of electrodes coupled to the fourth electrical termination, wherein each electrode of the eighth set is disposed between two electrodes of the seventh set of electrodes.

7. The capacitor device of claim 6 comprising a class 2 multilayer ceramic device, wherein each layer comprises an electrode of the first set of electrodes, the second set of electrodes, the third set of electrodes, or the fourth set of electrodes.

8. The capacitor device of claim 6, wherein the first set of electrodes and the fifth set of electrodes, comprises two electrodes each, the second set and the sixth set comprises one electrode each, the third set and the seventh set of electrodes comprises twelve electrodes each, and the fourth set and the eighth set of electrodes comprises eleven electrodes each.

9. The capacitor device of claim 6 comprising a first shielding layer between the first and the second stack, a second shielding layer between the second stack and the third stack, and a third shielding layer between the third stack and the fourth stack.

10. The capacitor device of claim 6 wherein comprising a shielding layer that comprises a fifth, a sixth, a seventh, and an eighth electrical termination.

11. The capacitor device of claim 10, wherein the shielding layer is an equilateral layer.

12. The capacitor device of claim 10, comprising:
a first side that comprises the first and the fifth electrical termination;
a second side that comprises the second and the sixth electrical termination;
a third side that comprises the third and the seventh electrical termination; and
a fourth side that comprises the fourth and the eighth electrical termination; and
wherein the first, the second, the third, and the fourth side are distinct sides of the capacitor device.

13. The capacitor device of claim 12, wherein the first side is adjacent to the second side, and wherein a distance between the first electrical termination and the second electrical termination is reduced.

14. The capacitor device of claim 10, comprising:
a first side that comprises the first and the second electrical termination;
a second side that comprises the third and the fourth electrical termination;
a third side that comprises the fifth and the sixth electrical termination; and
a fourth side that comprises the seventh and the eighth electrical termination; and
wherein the first, the second, the third, and the fourth side are distinct sides of the capacitor device.

15. The capacitor device of claim 6, wherein the first and the second capacitor comprises a rated voltage between 4V and 25V.

16. The capacitor device of claim 6, wherein the first and the second capacitor comprises a rated capacitance between 0.1 µF and 10 µF.

17. A capacitor device comprising:
first, second, third, and fourth distinct terminations;
a first set of layers, each layer comprising a first electrode coupled to the first termination and a second electrode coupled to the second termination;
a second set of layers, each layer comprising a third electrode coupled to the third termination and a fourth electrode coupled to the fourth termination, wherein the second set of layers is disposed atop the first set of layers;
a third set of layers, each layer comprising a fifth electrode coupled to the first termination and a sixth electrode coupled to the second termination, wherein the third set of layers is disposed atop the second set of layers; and
a fourth set of layers, each layer comprising a seventh electrode coupled to the third termination and an eighth electrode coupled to the fourth termination, wherein the fourth set of layers is disposed atop the third set of layers; and
wherein a nominal capacitance between the first and the third termination is the same as a nominal capacitance between the second and the fourth termination.

18. The capacitor device of claim 17, wherein a separation between the first electrode and the second electrode is 50 µm.

19. The capacitor device of claim 17, comprising a first corner adjacent to a first and a second side comprising the first termination, a second corner adjacent to the second side and a third side comprising the second termination, a third corner adjacent to the third side and a fourth side comprising the third termination, and a fourth corner adjacent to the fourth and the first side comprising the fourth termination.

20. The capacitor device of claim 17, wherein the first, the second, the third, and the fourth electrodes comprise a triangular layout.

21. An electrical device, comprising a capacitor device that comprises:
a first capacitor comprising a first electrical termination, a second electrical termination, a first stack of electrodes and a second stack of electrodes, wherein the first stack of electrodes comprises:
a first set of electrodes coupled to the first electrical termination; and
a second set of electrodes coupled to the second electrical termination, wherein each electrode of the second set is disposed between two electrodes of the first set of electrodes; and
wherein the second stack of electrodes comprises:
a third set of electrodes coupled to the first electrical termination; and
a fourth set of electrodes coupled to the second electrical termination, wherein each electrode of the fourth set is disposed between two electrodes of the third set of electrodes; and
a second capacitor comprising a third electrical termination, a fourth electrical termination, a third stack of electrodes, and a fourth stack of electrodes, wherein the third stack of electrodes comprises:
- a fifth set of electrodes coupled to the third electrical termination; and
- a sixth set of electrodes coupled to the fourth electrical termination, wherein each electrode of the sixth set of is disposed between two electrodes of the fifth set; and wherein the fourth stack of electrodes comprises:
- a seventh set of electrodes coupled to third electrical termination; and
- an eighth set of electrodes coupled to the fourth electrical termination, wherein each electrode of the eighth set is disposed between two electrodes of the seventh set.

* * * * *

UNITED STATES PATENT AND TRADEMARK OFFICE
CERTIFICATE OF CORRECTION

PATENT NO. : 10,461,040 B2
APPLICATION NO. : 15/636408
DATED : October 29, 2019
INVENTOR(S) : Paul A. Martinez et al.

Page 1 of 1

It is certified that error appears in the above-identified patent and that said Letters Patent is hereby corrected as shown below:

On the Title Page

IN THE ABSTRACT:
Line 7, delete "allow".

In the Claims

Claim 8, Column 19, Line 29, delete ",".

Claim 10, Column 19, Line 40, insert --,-- between "6" and "wherein".

Claim 21, Column 21, Line 7, insert --electrodes-- between "of" and "is".

Signed and Sealed this
Eleventh Day of February, 2020

Andrei Iancu
*Director of the United States Patent and Trademark Office*